(12) United States Patent
Kusumoto et al.

(10) Patent No.: US 10,770,222 B2
(45) Date of Patent: Sep. 8, 2020

(54) MULTILAYER ELECTRONIC COMPONENT

(71) Applicant: TDK CORPORATION, Tokyo (JP)

(72) Inventors: Shohei Kusumoto, Tokyo (JP); Noriaki Ootsuka, Tokyo (JP); Minoru Abe, Tokyo (JP); Yoshinori Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 344 days.

(21) Appl. No.: 15/940,301

(22) Filed: Mar. 29, 2018

(65) Prior Publication Data
US 2018/0315545 A1 Nov. 1, 2018

(30) Foreign Application Priority Data

Apr. 26, 2017 (JP) .................. 2017-087622

(51) Int. Cl.
| | |
|---|---|
| H01F 27/36 | (2006.01) |
| H01F 27/40 | (2006.01) |
| H01G 4/228 | (2006.01) |
| H01G 4/30 | (2006.01) |
| H01F 27/28 | (2006.01) |
| H01F 27/29 | (2006.01) |
| H01F 17/00 | (2006.01) |
| H03H 1/00 | (2006.01) |
| H01G 4/38 | (2006.01) |
| H01G 4/232 | (2006.01) |
| H01G 4/40 | (2006.01) |

(52) U.S. Cl.
CPC ......... *H01F 27/36* (2013.01); *H01F 17/0013* (2013.01); *H01F 27/28* (2013.01); *H01F 27/292* (2013.01); *H01F 27/362* (2013.01); *H01F 27/40* (2013.01); *H01G 4/228* (2013.01); *H01G 4/232* (2013.01); *H01G 4/30* (2013.01); *H01G 4/38* (2013.01); *H01G 4/40* (2013.01); *H03H 1/00* (2013.01); *H01F 2017/008* (2013.01)

(58) Field of Classification Search
CPC ...... H01F 27/36; H01F 17/0013; H01F 27/28; H01F 27/292; H01F 27/362; H01F 27/40; H01F 27/34; H01F 27/2804; H01F 2017/008; H01G 4/228; H01G 4/232; H01G 4/13; H01G 4/38; H01G 4/40; H03H 1/00; H05K 9/0064
See application file for complete search history.

(56) References Cited

U.S. PATENT DOCUMENTS

| | | | |
|---|---|---|---|
| 6,822,534 B2 | 11/2004 | Uriu et al. | |
| 2003/0143958 A1* | 7/2003 | Elias | H01L 23/3733 |
| | | | 455/73 |

(Continued)

*Primary Examiner* — Adolf D Berhane
(74) *Attorney, Agent, or Firm* — Oliff PLC

(57) ABSTRACT

A multilayer electronic component includes: a multilayer stack including a plurality of dielectric layers and a plurality of conductor layers stacked together; a plurality of terminals integrated with the multilayer stack; and a shield formed of a conductor and integrated with the multilayer stack. The multilayer stack has a top surface, a bottom surface, and four side surfaces connecting the top surface and the bottom surface. The plurality of terminals are provided on the bottom surface of the multilayer stack. The shield entirely covers the top surface and the four side surfaces of the multilayer stack. The shield includes a portion that is thicker than the other portions of the shield.

8 Claims, 15 Drawing Sheets

(56) References Cited

U.S. PATENT DOCUMENTS

| | | | |
|---|---|---|---|
| 2006/0011808 A1* | 1/2006 | Li | H01L 27/14685 |
| | | | 250/208.1 |
| 2007/0133147 A1* | 6/2007 | Ritter | H01G 4/30 |
| | | | 361/306.3 |
| 2015/0097734 A1* | 4/2015 | Zhao | A61N 1/37229 |
| | | | 343/702 |
| 2017/0110240 A1 | 4/2017 | Masuda et al. | |
| 2018/0199427 A1* | 7/2018 | Miyahara | H05K 1/0269 |
| 2019/0198959 A1* | 6/2019 | Ashida | H01P 1/2039 |
| 2019/0199313 A1* | 6/2019 | Ashida | H01L 23/66 |
| 2019/0326654 A1* | 10/2019 | Ashida | H01P 1/18 |

* cited by examiner

MULTILAYER ELECTRONIC COMPONENT

BACKGROUND OF THE INVENTION

1. Field of the Invention

The present invention relates to a multilayer electronic component including a multilayer stack that includes a plurality of dielectric layers and a plurality of conductor layers stacked together.

2. Description of the Related Art

Recently, compact mobile communication apparatuses typified by cellular phones and smartphones have achieved greater functionality and further miniaturization, and the packing densities of electronic components have increased accordingly. As a result, spacings between the electronic components mounted on a mount substrate or distances from the electronic components to a shield case covering the electronic components have been reduced in the compact mobile communication apparatuses.

Among known electronic components suitable for miniaturization are multilayer electronic components that are each formed using a multilayer stack including a plurality of dielectric layers and a plurality of conductor layers stacked together, as disclosed in, for example, U.S. Pat. No. 6,822,534 B2 and U.S. Patent Application Publication No. 2017/0110240 A1. Among such multilayer electronic components, ones configured with a plurality of terminals arranged on the bottom surface of the multilayer stack are particularly suitable for high-density packing, because the terminals do not appear on any side surface of the multilayer stack.

Due to the recent increases in packing density of electronic components, the occurrence of electromagnetic troubles as described below has become an issue of concern. Specifically, as the spacing between the electronic components is reduced, electromagnetic interference is more likely to occur between the electronic components. Further, as the distances between the shield case and the electronic components are reduced, the electronic components as packaged are more likely to have different characteristics than those as designed, due to capacitances formed by conductors inside the electronic components and the shield case.

U.S. Pat. No. 6,822,534 B2 discloses an electronic component configured so that two shield electrodes inside the multilayer stack are electrically connected to a plurality of end-face electrodes provided on a plurality of side surfaces of the multilayer stack, and one of the two shield electrodes is connected to a ground electrode through a via hole.

In the electronic component disclosed in U.S. Pat. No. 6,822,534 B2, however, components inside the multilayer stack are not completely covered by the upper one of the two shield electrodes and the plurality of end-face electrodes. It is thus difficult with the disclosed electronic component to sufficiently reduce the occurrence of the electromagnetic troubles associated with the increased packing density as described above.

U.S. Patent Application Publication No. 2017/0110240 A1 discloses an electronic component including a shield electrode of a cylindrical shape that covers the four side surfaces of the multilayer stack. However, it is difficult with the shield electrode of a cylindrical shape to sufficiently reduce the occurrence of the electromagnetic troubles.

U.S. Patent Application Publication No. 2017/0110240 A1 further discloses an example in which the shield electrode covers the top surface of the multilayer stack as well as the four side surfaces thereof. Even with this example, however, the occurrence of the electromagnetic troubles are not always preventable.

SUMMARY OF THE INVENTION

It is an object of the present invention to provide a multilayer electronic component configured to prevent the occurrence of electromagnetic troubles associated with increased packing density.

A multilayer electronic component of each of first to fifth aspects of the present invention includes: a multilayer stack including a plurality of dielectric layers and a plurality of conductor layers stacked together; a plurality of terminals integrated with the multilayer stack; and a shield formed of a conductor and integrated with the multilayer stack.

The multilayer stack has a top surface and a bottom surface located at opposite ends in a first direction, and four side surfaces connecting the top surface and the bottom surface. The plurality of terminals are provided on the bottom surface of the multilayer stack. The shield entirely covers the top surface and the four side surfaces of the multilayer stack.

In the multilayer electronic component of the first aspect of the present invention, the shield includes a portion thicker than the other portions of the shield. In such a case, the shield may include a top covering portion covering the top surface of the multilayer stack, and four side covering portions covering the four side surfaces of the multilayer stack. The top covering portion may be thicker than the four side covering portions.

In the multilayer electronic component of the first aspect of the present invention, the multilayer stack may include a coil wound around a central axis extending in a second direction. The shield may include five portions that respectively cover the top surface and the four side surfaces of the multilayer stack. Of the five portions, one or two portions that intersect the central axis may be thicker than the others of the five portions. One of the five portions that covers the top surface of the multilayer stack may intersect the central axis.

In the multilayer electronic component of the second aspect of the present invention, the shield includes a plurality of metal layers stacked together. Each of the plurality of metal layers includes a top-surface-corresponding portion covering the top surface of the multilayer stack, and four side-surface-corresponding portions respectively covering the four side surfaces of the multilayer stack. The top-surface-corresponding portion and the four side-surface-corresponding portions are contiguous.

In the multilayer electronic component of the third aspect of the present invention, the shield includes a top covering portion covering the top surface of the multilayer stack, four side covering portions covering the four side surfaces of the multilayer stack, and a partial covering portion contiguous to the four side covering portions and partially covering the bottom surface of the multilayer stack.

In the multilayer electronic component of the fourth aspect of the present invention, the top surface of the multilayer stack includes a mark portion and a peripheral portion around the mark portion. There is a difference in level between the mark portion and the peripheral portion. The shield includes a top covering portion covering the top surface of the multilayer stack. The top covering portion has a top surface including a mark-corresponding portion corresponding to the mark portion, and a periphery-corresponding portion corresponding to the peripheral portion. There is a difference in level between the mark-corresponding portion and the periphery-corresponding portion.

In the multilayer electronic component of the fifth aspect of the present invention, the plurality of terminals include a plurality of signal terminals, and a ground terminal connected to the ground. The shield includes a bottom covering portion that partially covers the bottom surface of the multilayer stack and that is connected to the ground terminal without coming into contact with the plurality of signal terminals.

According to the multilayer electronic components of the first to fifth aspects of the present invention, the shields entirely cover the top surface and the four side surfaces of the multilayer stack, and have the respective additional features. This enables prevention of the occurrence of the electromagnetic troubles associated with increased packing density.

Other and further objects, features and advantages of the invention will appear more fully from the following description.

DETAILED DESCRIPTION OF THE PREFERRED EMBODIMENTS

First Embodiment

Figure 1:
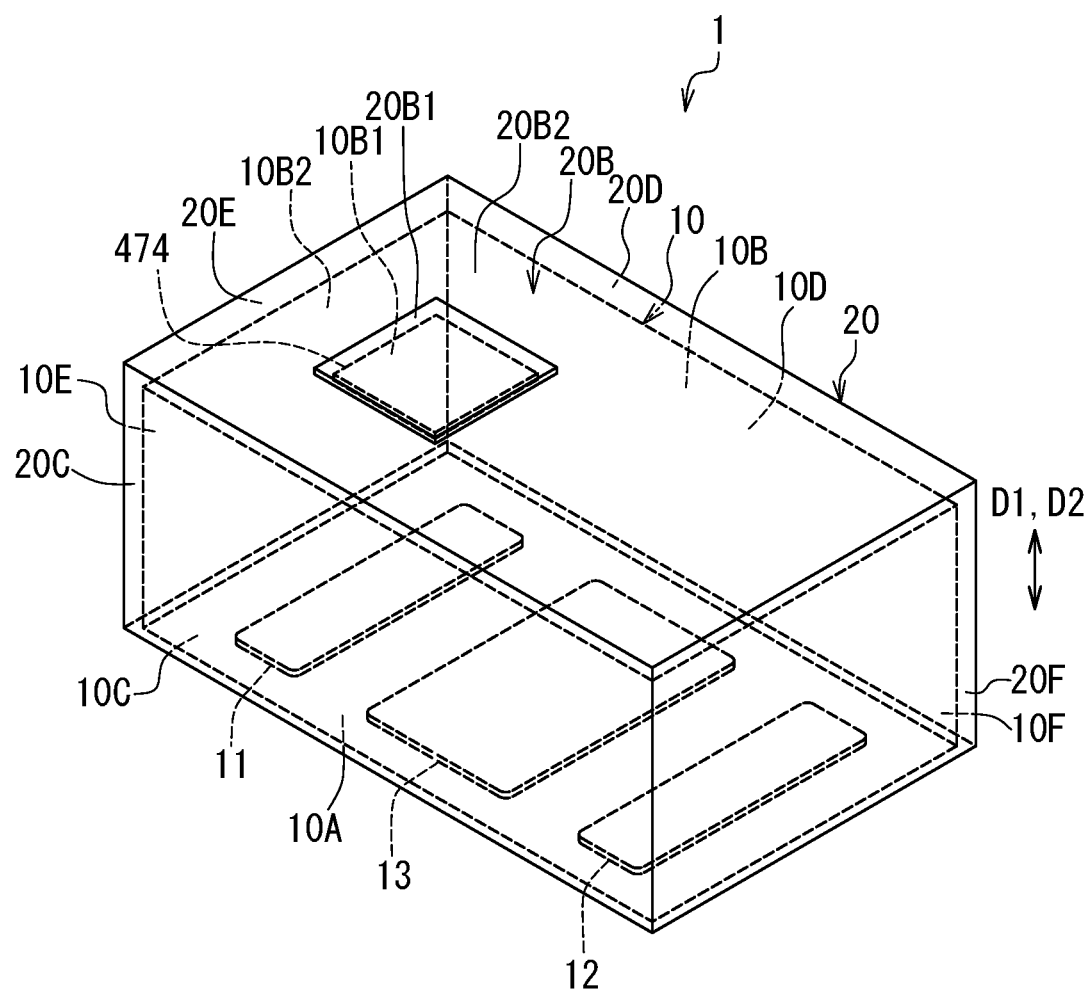
FIG. 1 is an external perspective view of a multilayer electronic component according to a first embodiment of the invention.
Figure 2:
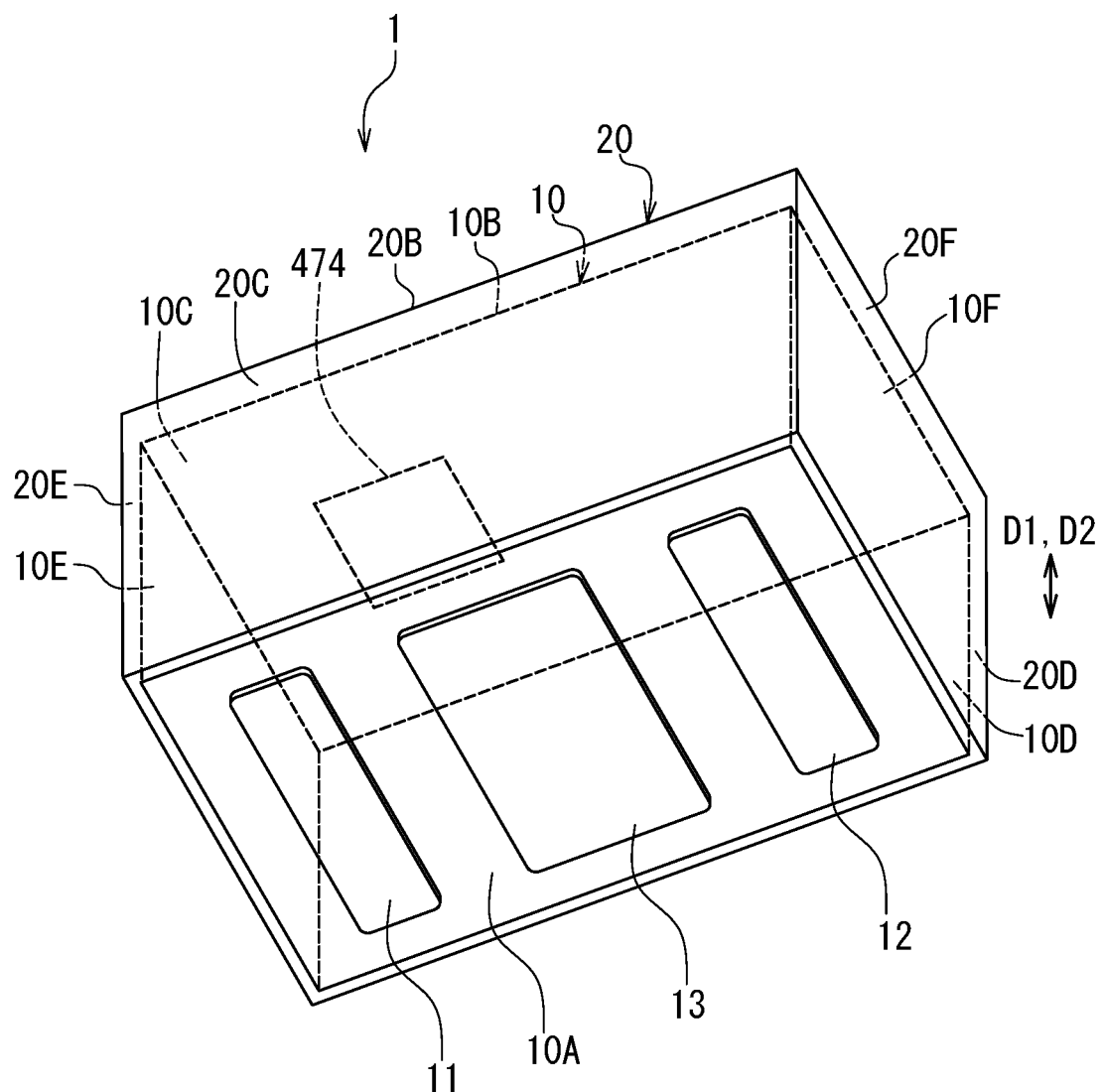
FIG. 2 is a perspective view illustrating the bottom of the multilayer electronic component of FIG. 1.
Figure 3:
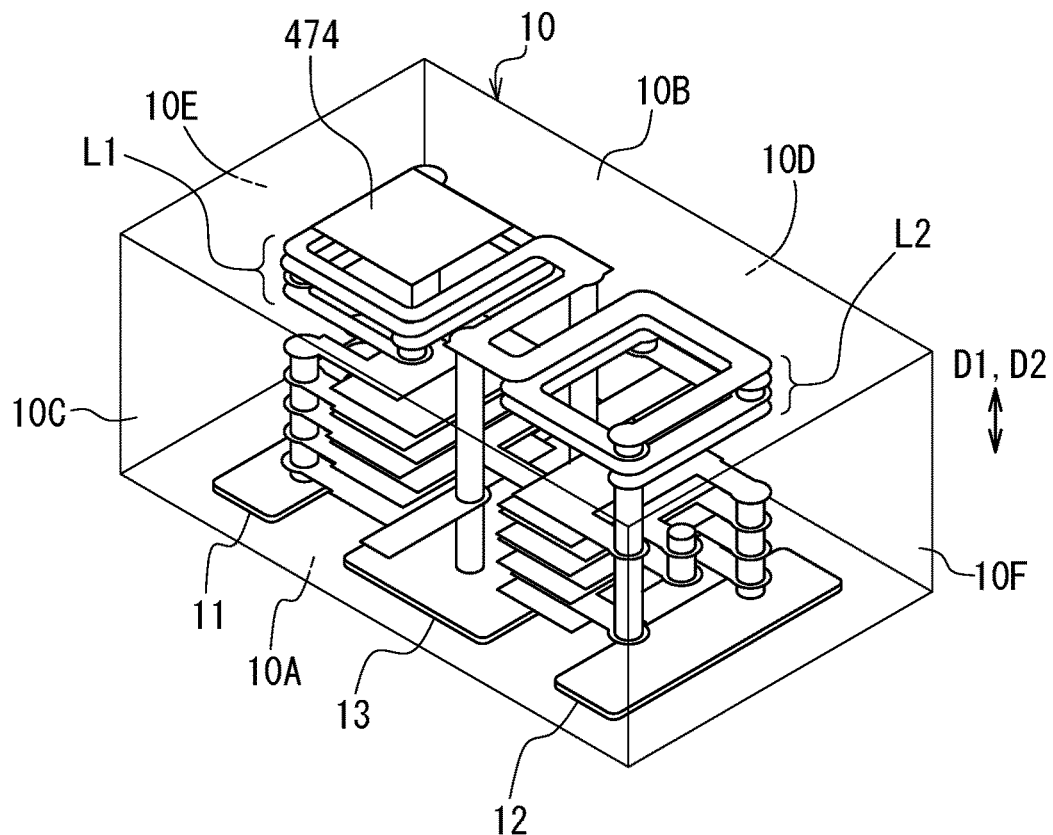
FIG. 3 is an internal perspective view of a multilayer stack in the multilayer electronic component of FIG. 1.
Figure 4:
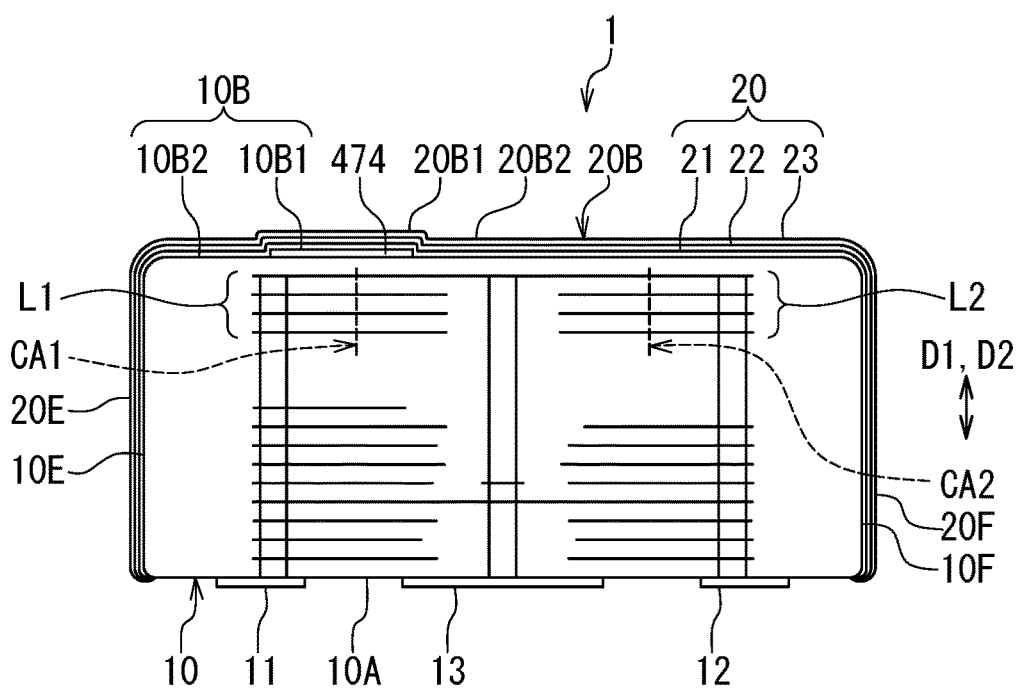
FIG. 4 is a cross-sectional view of the multilayer electronic component of FIG. 1.

Preferred embodiments of the present invention will now be described in detail with reference to the drawings. First, reference is made to FIG. 1 to FIG. 4 to describe an example structure of a multilayer electronic component (hereinafter simply referred to as electronic component) 1 according to a first embodiment of the invention. FIG. 1 is an external perspective view of the electronic component 1. FIG. 2 is a perspective view illustrating the bottom of the electronic component 1. FIG. 3 is an internal perspective view of a multilayer stack in the electronic component 1. FIG. 4 is a cross-sectional view of the electronic component 1.

The electronic component 1 is for use in compact mobile communication apparatuses such as cellular phones and smartphones. The electronic component 1 may have the function of a filter, a balun, a directional coupler or a branching filter, for example.

The electronic component 1 includes a multilayer stack 10, a plurality of terminals integrated with the multilayer stack 10, and a shield 20 formed of a conductor and integrated with the multilayer stack 10. The multilayer stack 10 includes a plurality of dielectric layers and a plurality of conductor layers stacked together. In the example shown in FIG. 1 to FIG. 4, the plurality of terminals are two signal terminals 11 and 12 and a ground terminal 13.

The multilayer stack 10 has a bottom surface 10A and a top surface 10B located at opposite ends in a first direction D1, and four side surfaces 10C to 10F connecting the bottom surface 10A and the top surface 10B. The side surfaces 10C and 10D are opposite to each other. The side surfaces 10E and 10F are opposite to each other. The side surfaces 10C to 10F are perpendicular to the top surface 10B and the bottom surface 10A. In the example shown in FIG. 1 to FIG. 4, the first direction D1 is the direction in which the plurality of dielectric layers of the multilayer stack 10 are stacked.

As used herein to describe relative positions, the terms "upper" and "above" refer to positions located in the direction parallel to the first direction D1 and from the bottom surface 10A to the top surface 10B with respect to a reference position, and the terms "lower" and "below" refer to positions located in the direction parallel to the first direction D1 and from the top surface 10B to the bottom surface 10A with respect to the reference position.

The terminals 11, 12 and 13 are provided on the bottom surface 10A. Each of the terminals 11, 12 and 13 may have a bottom end face located at the lower end thereof. The bottom end faces of the terminals 11, 12 and 13 may protrude from or coplanar with the bottom surface 10A. FIG. 1 to FIG. 4 illustrate an example in which the bottom end faces of the terminals 11, 12 and 13 protrude from the bottom surface 10A. When the bottom end faces of the terminals 11, 12 and 13 are coplanar with the bottom surface 10A, the terminals 11, 12 and 13 are embedded in the multilayer stack 10 with their bottom end faces exposed.

The shield 20 entirely covers the top surface 10B and the four side surfaces 10C to 10F of the multilayer stack 10. The shield 20 includes five portions: one covering the top surface 10B of the multilayer stack 10; the other four covering the four side surfaces 10C to 10F of the multilayer stack 10. Of the five portions of the shield 20, the one portion covering the top surface 10B of the multilayer stack 10 will be referred to as the top covering portion 20B, and the four portions covering the side surfaces 10C to 10F of the multilayer stack 10 will be referred to as the side covering portions 20C to 20F.

The shield 20 may include a plurality of metal layers stacked together. In such a case, each of the plurality of metal layers includes a top-surface-corresponding portion covering the top surface 10B of the multilayer stack 10, and four side-surface-corresponding portions respectively covering the four side surfaces 10C to 10F of the multilayer stack 10. The top-surface-corresponding portion and the four side-surface-corresponding portions are preferably contiguous.

FIG. 4 illustrates an example in which the shield 20 is composed of a plurality of metal layers 21, 22 and 23 stacked together. Each of the metal layers 21, 22 and 23 includes the top-surface-corresponding portion and the four side-surface-corresponding portions, the top-surface-corresponding portion and the four side-surface-corresponding portions being contiguous. The metal layer 21 entirely covers the top surface 10B and the four side surfaces 10C to 10F of the multilayer stack 10. The metal layer 22 entirely covers the metal layer 21. The metal layer 23 entirely covers the metal layer 22.

The metal layer 22 may be higher in electrical conductivity than the metal layers 21 and 23. In such a case, the material of the metal layer 22 may be one of Ag, Cu, Au, and Al. Further, the metal layer 22 may be thicker than the metal layers 21 and 23. The metal layers 21 and 23 may have the function of preventing corrosion of the metal layer 22. In such a case, the metal layers 21 and 23 may be formed of stainless steel.

A portion of the shield 20 may be thicker than the other portions of the shield 20. This enables enhancement of the function of the shield 20 at this portion of the shield 20 without involving an excessive increase in the thickness of the other portions of the shield 20. For example, the top covering portion 20B may be thicker than the side covering portions 20C to 20F.

The multilayer stack 10 may include at least one of an inductor and a capacitor. The multilayer stack 10 may further include a coil wound around a central axis extending in a second direction D2. In such a case, of the five portions 20B to 20F of the shield 20, one or two portions that intersect the central axis are preferably thicker than the others of the five portions.

In the example shown in FIG. 1 to FIG. 4, the second direction D2 is the same direction as the first direction D1, that is, the direction in which the plurality of dielectric layers of the multilayer stack 10 are stacked. In this case, the top covering portion 20B intersects the aforementioned central axis. Thus, the top covering portion 20B is preferably thicker than the side covering portions 20C to 20F.

Now, an example of thickness of each of the metal layers 21, 22 and 23 of the shield 20 will be described. In this example, the top-surface-corresponding portion of each of the metal layers 21 and 23 is 0.2 μm thick, and the four side-surface-corresponding portions of each of the metal layers 21 and 23 are 0.1 μm thick. Further, in this example the top-surface-corresponding portion of the metal layer 22 is 2 μm thick, and the four side-surface-corresponding portions of the metal layer 22 are 1 μm thick. In this example the top covering portion 20B of the shield 20 is 2.4 thick, and the side covering portions 20C to 20F of the shield 20 are 1.2 μm thick.

The multilayer stack 10 may have a plurality of rounded corners. The plurality of rounded corners are at which two or three of the six surfaces of the multilayer stack 10 intersect each other.

A plurality of corners at which the top surface 10B intersects one or two of the four side surfaces 10C to 10F may have a radius of curvature greater than that of a plurality of corners at which the bottom surface 10A intersects one or two of the four side surfaces 10C to 10F. The plurality of corners at which the top surface 10B intersects the one or two of the four side surfaces 10C to 10F have a radius of curvature on the order of 10 μm, for example.

Figure 5:
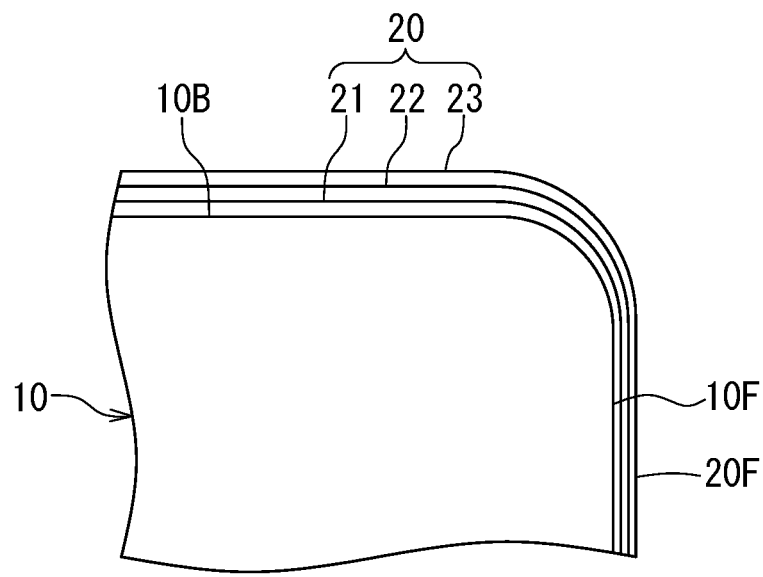
FIG. 5 is a cross-sectional view of a portion of the multilayer electronic component of FIG. 4.
Figure 6:
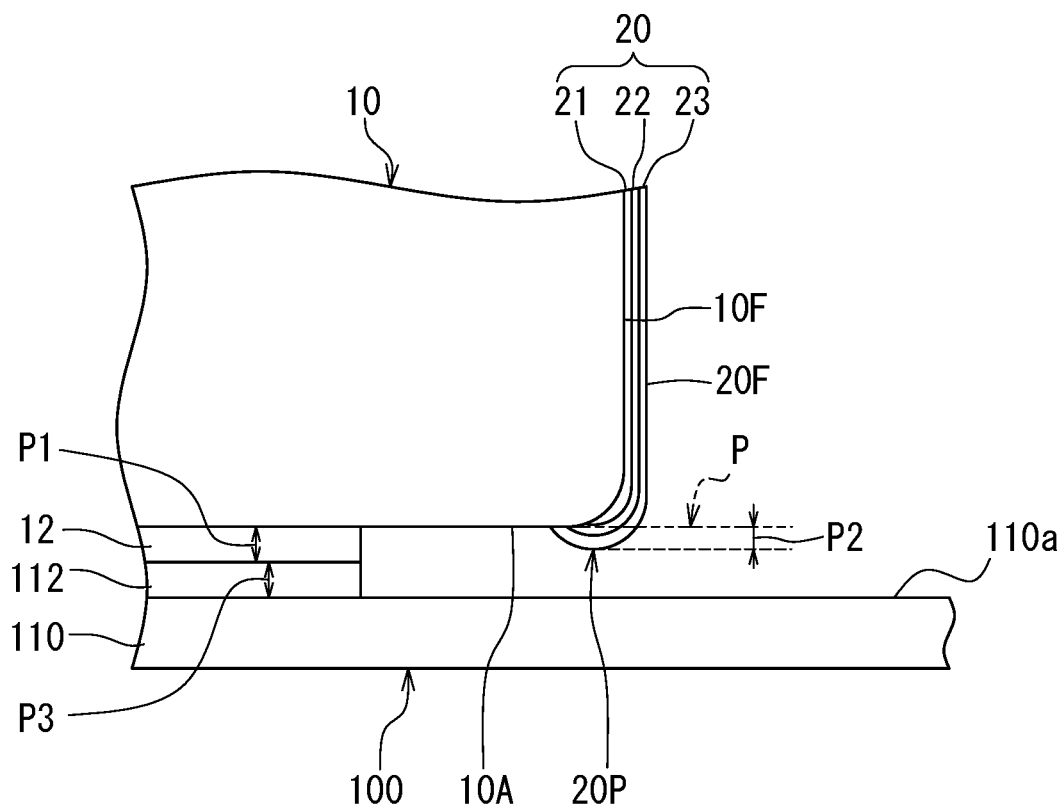
FIG. 6 is a cross-sectional view illustrating a first example of relations between a partial covering portion of a shield and terminals in the first embodiment of the invention.
Figure 7:
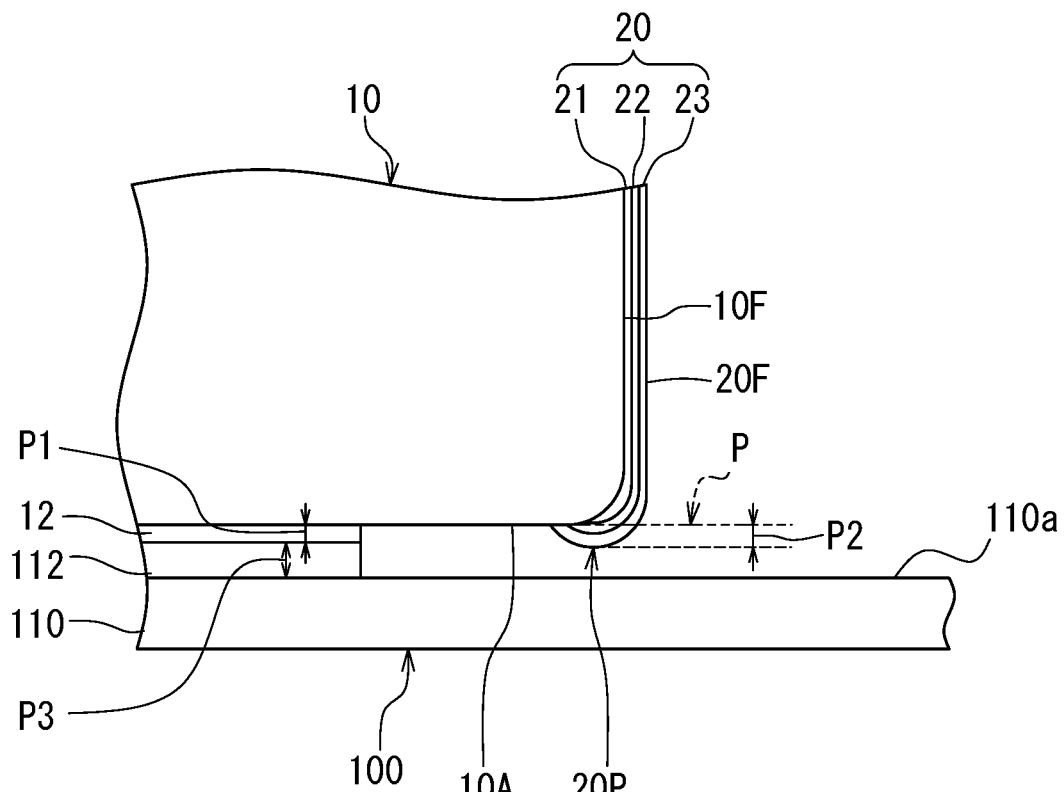
FIG. 7 is a cross-sectional view illustrating a second example of relations between the partial covering portion of the shield and the terminals in the first embodiment of the invention.

FIG. 5 illustrates a corner at which the top surface 10B intersects the side surface 10F, and the vicinity thereof. FIG. 6 and FIG. 7 illustrate a corner at which the bottom surface 10A intersects the side surface 10F, and the vicinity thereof.

As shown in FIG. 6 and FIG. 7, the shield 20 may include a partial covering portion 20P contiguous to the side covering portions 20C to 20F and partially covering the bottom surface 10A of the multilayer stack 10. Among the four side covering portions 20C to 20F, only the side covering portion 20F is shown in FIG. 6 and FIG. 7. The partial covering portion 20P has a bottom end located at its lower end.

Now, a first and a second example of relations between the partial covering portion 20P and the terminals will be described with reference to FIG. 6 and FIG. 7. FIG. 6 and FIG. 7 illustrate a state in which the electronic component 1 is mounted on a mount substrate 100. The mount substrate 100 includes a substrate body 110 shaped like a plate and having a top surface 110a, and a plurality of electrodes provided on the top surface 110a of the substrate body 110. Each of the plurality of electrodes has a top end face located at its upper end. The top end face protrudes from the top surface 110a of the substrate body 110. The plurality of electrodes of the mount substrate 100 include three electrodes for connection with the terminals 11, 12 and 13 of the electronic component 1. FIG. 6 and FIG. 7 show the terminal 12 of the electronic component 1, and an electrode 112 to which the terminal 12 is connected.

Now, as shown in FIG. 6 and FIG. 7, let us assume an imaginary plane P including the bottom surface 10A of the multilayer stack 10. The distance from the imaginary plane P to the bottom end face of each terminal of the electronic component 1 will be referred to as terminal protrusion amount, and denoted by the symbol P1. When the bottom end face of each of the terminals 11, 12 and 13 is coplanar with the bottom surface 10A, the terminal protrusion amount P1 is zero. The distance from the imaginary plane P to the bottom end of the partial covering portion 20P will be referred to as protrusion amount of the partial covering portion 20P, and denoted by the symbol P2. The distance from the top surface 110a of the substrate body 110 to the top end face of each electrode of the mount substrate 100 will be referred to as electrode protrusion amount, and denoted by the symbol P3.

As in the first example shown in FIG. 6, the protrusion amount P2 of the partial covering portion 20P may be smaller than the terminal protrusion amount P1. Alternatively, as in the second example shown in FIG. 7, the protrusion amount P2 of the partial covering portion 20P may be greater than the terminal protrusion amount P1. Alternatively, the protrusion amount P2 of the partial covering portion 20P may be equal to the terminal protrusion amount P1.

The protrusion amount P2 of the partial covering portion 20P needs to be smaller than or equal to the sum of the terminal protrusion amount P1 and the electrode protrusion amount P3. The partial covering portion 20P has the function of inhibiting electromagnetic waves from passing through a gap between the bottom surface 10A of the multilayer stack 10 and the top surface 110a of the substrate body 110 of the mount substrate 100. To allow this function to be performed effectively, the protrusion amount P2 of the partial covering portion 20 is preferably equal or nearly equal to the sum of the terminal protrusion amount P1 and the electrode protrusion amount P3.

As shown in FIG. 1 and FIG. 4, the top surface 10B of the multilayer stack 10 includes a mark portion 10B1 and a peripheral portion 10B2 around the mark portion 10B1. There is a difference in level between the mark portion 10B1 and the peripheral portion 10B2. In other words, the mark portion 10B1 protrudes or recessed from the peripheral portion 10B2. FIG. 1 and FIG. 4 illustrate an example in which the mark portion 10B1 protrudes from the peripheral portion 10B2. In this example, a mark layer 474 formed of a conductor layer is provided on the top surface of one of the dielectric layers of the multilayer stack 10 that is closest to the top surface 10B, and the top surface of the mark layer 474 constitutes the mark portion 10B1. An example in which the mark portion 10B1 is recessed from the peripheral portion 10B2 will be shown later as a modification example.

Due to the difference in level between the mark portion 10B1 and the peripheral portion 10B2 as described above, the top surface of the top covering portion 20B of the shield 20 includes a mark-corresponding portion 20B1 corresponding to the mark portion 10B1, and a periphery-corresponding portion 20B2 corresponding to the peripheral portion 10B2. The mark-corresponding portion 20B1 is located to correspond to the mark portion 10B1. The periphery-corresponding portion 20B2 lies around mark-corresponding portion 20B1. Between the mark-corresponding portion 20B1 and the periphery-corresponding portion 20B2, there is a difference in level similar to that between the mark portion 10B1 and the peripheral portion 10B2. In the present embodiment, the mark-corresponding portion 20B1 corresponding to the mark portion 10B1 is recognizable even if the mark portion 10B1 is covered with the top covering portion 20B of the shield 20. The mark-corresponding portion 20B1 is used to recognize, for example, the positional relationship between the terminals 11, 12 and 13 of the electronic component 1.

The shield 20 is electrically connected to the ground terminal 13. The multilayer stack 10 shown in FIG. 3 includes two connecting portions for electrically connecting the shield 20 and the ground terminal 13. The two connecting portions will be described in detail later.

An example circuit configuration of the electronic component 1 will now be described with reference to FIG. 8. In this example, the electronic component 1 has the function of a high-pass filter. The electronic component 1 in this example includes four capacitors C1, C2, C3 and C4, and two inductors L1 and L2. The capacitors C1 to C4 and the inductors L1 and L2 each have a first end and a second end opposite to each other.

The first end of the capacitor C1 is connected to the signal terminal 11. The first end of the capacitor C2 is connected to the second end of the capacitor C1. The second end of the capacitor C2 is connected to the signal terminal 12.

The first end of the capacitor C3 is connected to the signal terminal 11. The first end of the inductor L1 is connected to the second end of the capacitor C3. The first end of the capacitor C4 is connected to the signal terminal 12. The first end of the inductor L2 is connected to the second end of the capacitor C4. The second end of the inductor L1 and the second end of the inductor L2 are connected to the ground terminal 13.

The capacitors C1 to C4 and the inductors L1 and L2 are all included in the multilayer stack 10. In the example shown in FIG. 3 and FIG. 4, each of the inductors L1 and L2 is formed of a coil. As shown in FIG. 4, the coil forming the inductor L1 is wound around a central axis CA1 extending in the second direction D2. The coil forming the inductor L2 is wound around a central axis CA2 extending in the second direction D2. In this case, among the five portions 20B to 20F of the shield 20, the top covering portion 20B intersects the central axes CA1 and CA2. Thus, as described previously, the top covering portion 20B is preferably thicker than the side covering portions 20C to 20F.

Figure 9A:
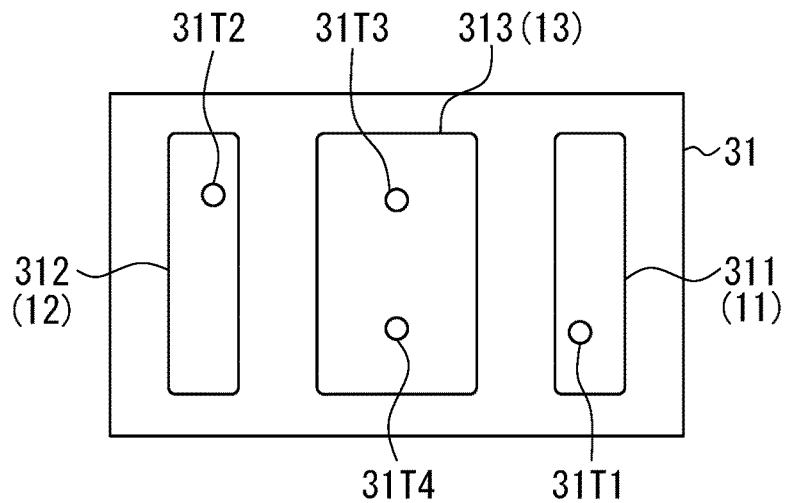
FIG. 9A is an explanatory diagram illustrating a patterned surface of a first dielectric layer of the multilayer stack shown in FIG. 3.
Figure 9B:
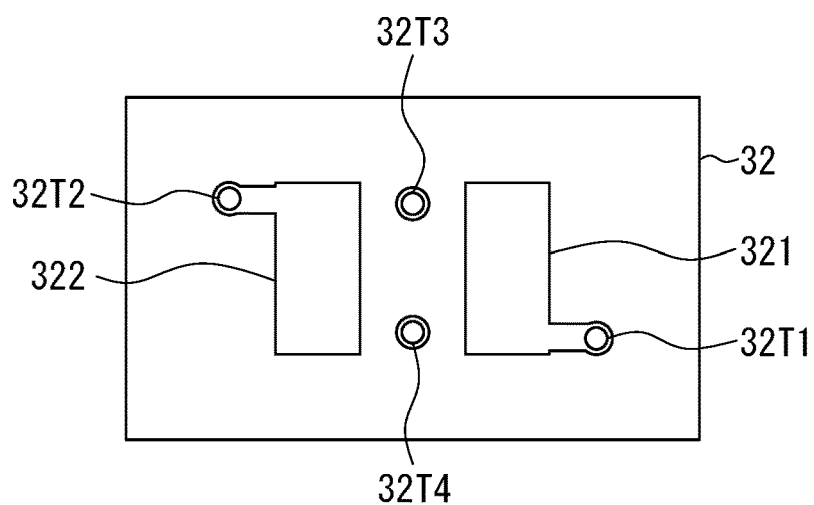
FIG. 9B is an explanatory diagram illustrating a patterned surface of a second dielectric layer of the multilayer stack shown in FIG. 3.
Figure 9C:
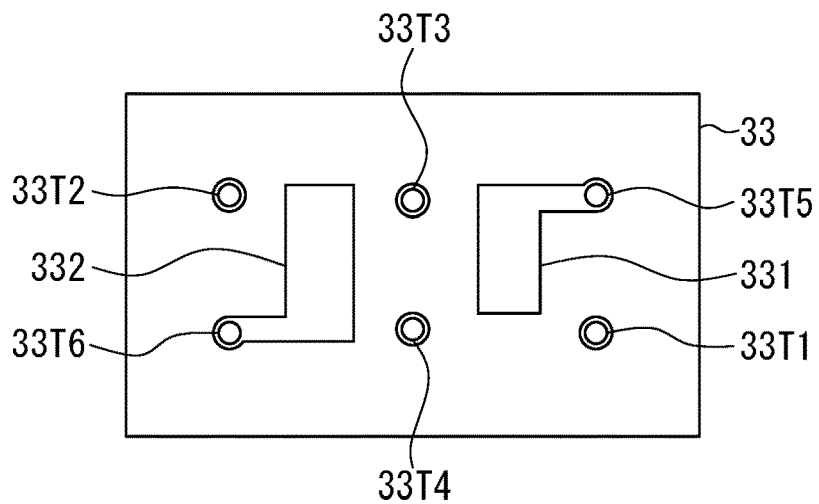
FIG. 9C is an explanatory diagram illustrating a patterned surface of a third dielectric layer of the multilayer stack shown in FIG. 3.
Figure 10A:
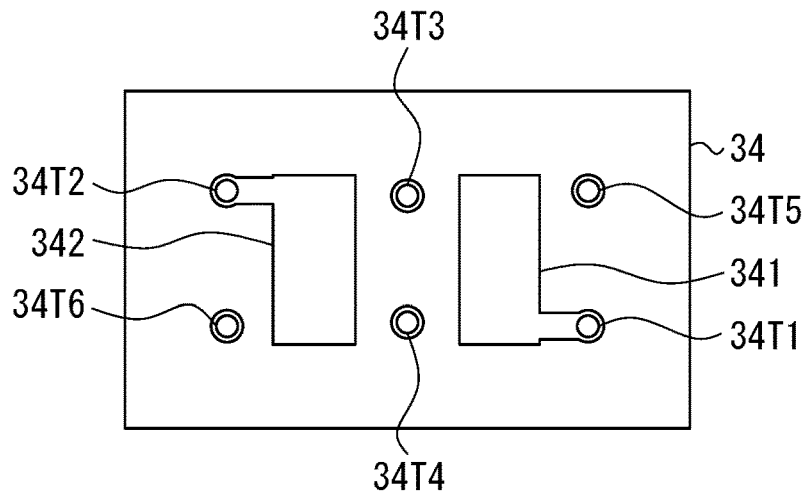
FIG. 10A is an explanatory diagram illustrating a patterned surface of a fourth dielectric layer of the multilayer stack shown in FIG. 3.
Figure 10B:
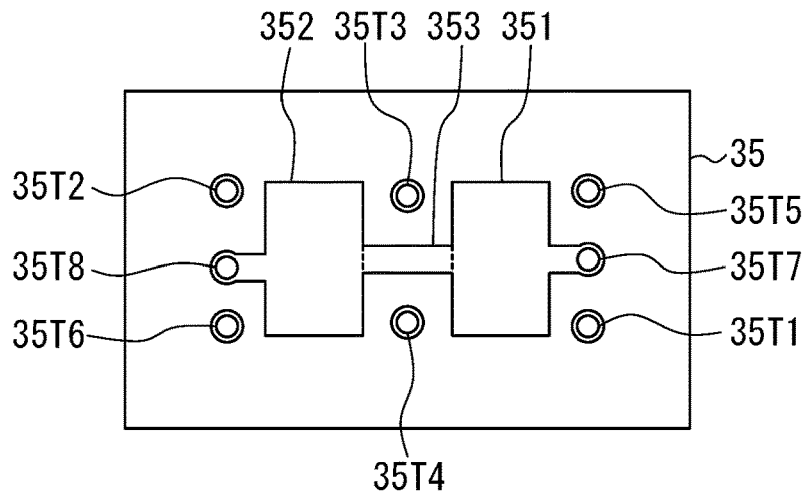
FIG. 10B is an explanatory diagram illustrating a patterned surface of a fifth dielectric layer of the multilayer stack shown in FIG. 3.
Figure 10C:
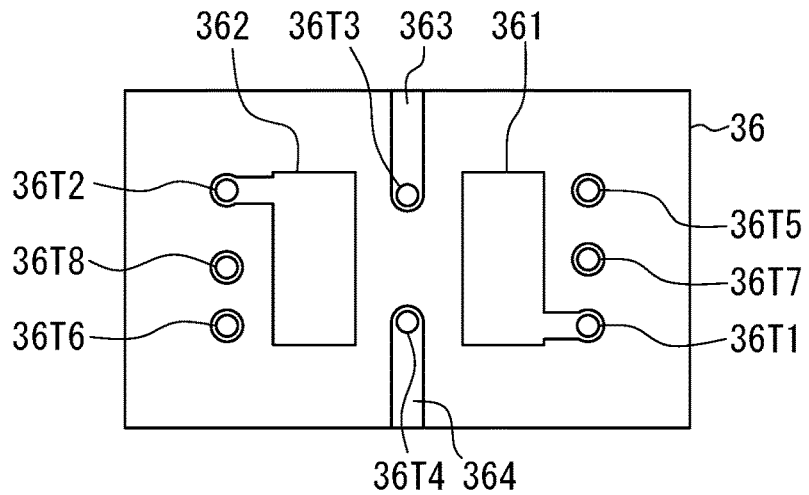
FIG. 10C is an explanatory diagram illustrating a patterned surface of a sixth dielectric layer of the multilayer stack shown in FIG. 3.
Figure 11A:
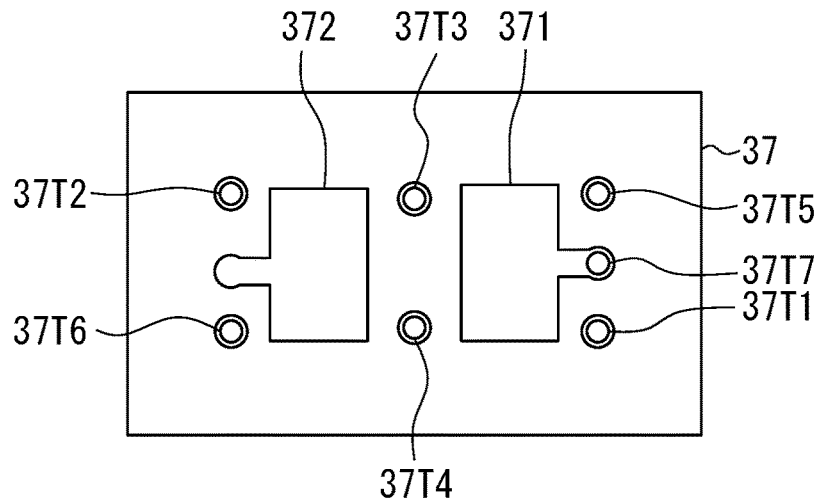
FIG. 11A is an explanatory diagram illustrating a patterned surface of a seventh dielectric layer of the multilayer stack shown in FIG. 3.
Figure 11B:
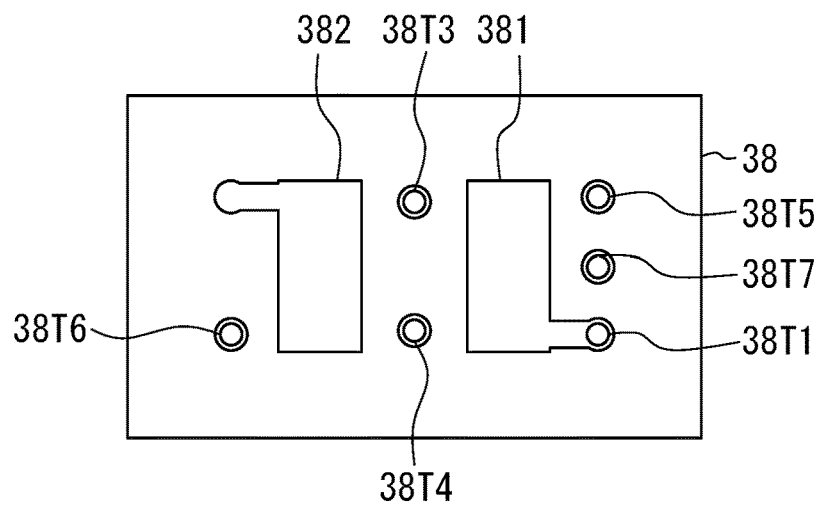
FIG. 11B is an explanatory diagram illustrating a patterned surface of an eighth dielectric layer of the multilayer stack shown in FIG. 3.
Figure 11C:
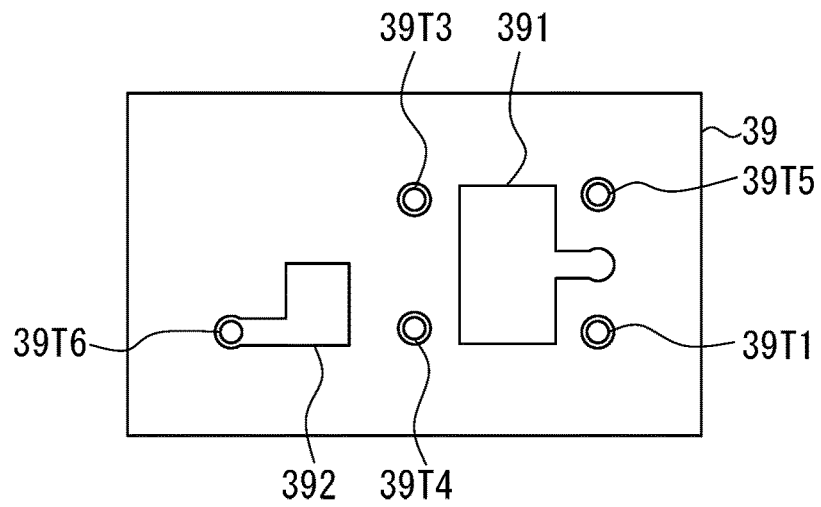
FIG. 11C is an explanatory diagram illustrating a patterned surface of a ninth dielectric layer of the multilayer stack shown in FIG. 3.
Figure 12A:
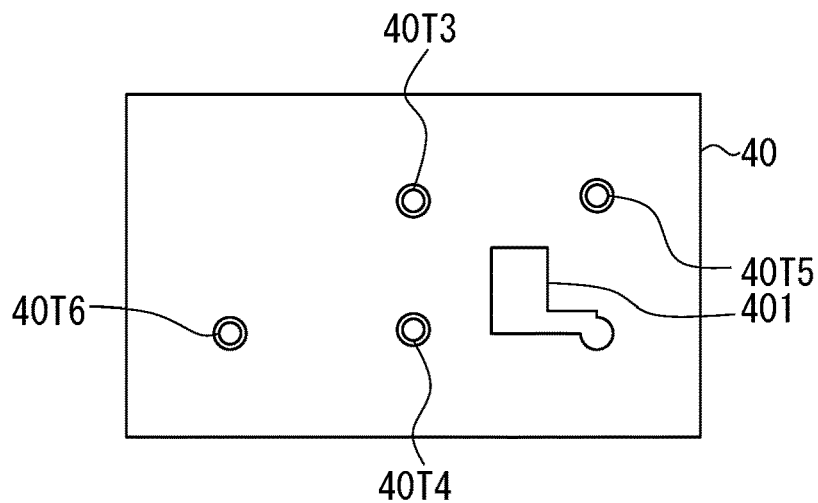
FIG. 12A is an explanatory diagram illustrating a patterned surface of a tenth dielectric layer of the multilayer stack shown in FIG. 3.
Figure 12B:
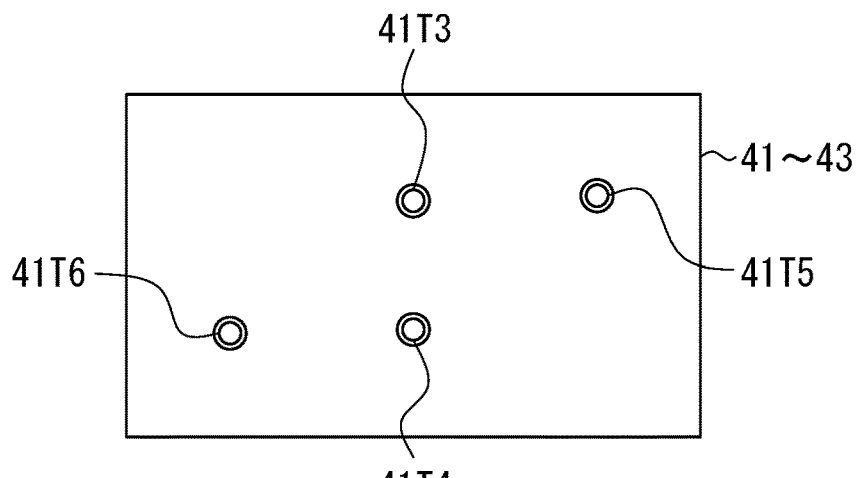
FIG. 12B is an explanatory diagram illustrating a patterned surface of each of an eleventh to a thirteenth dielectric layer of the multilayer stack shown in FIG. 3.
Figure 12C:
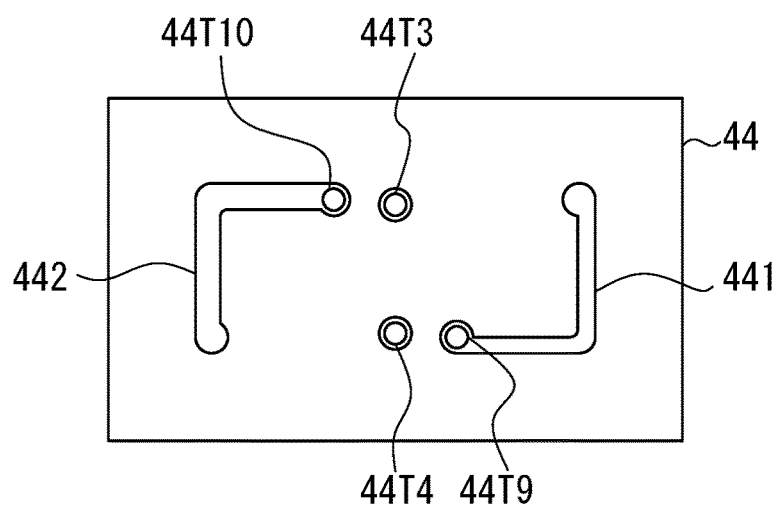
FIG. 12C is an explanatory diagram illustrating a patterned surface of a fourteenth dielectric layer of the multilayer stack shown in FIG. 3.
Figure 13A:
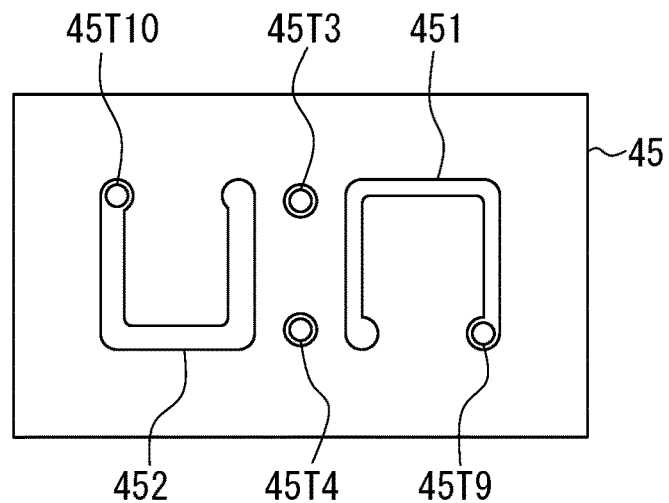
FIG. 13A is an explanatory diagram illustrating a patterned surface of a fifteenth dielectric layer of the multilayer stack shown in FIG. 3.
Figure 13B:
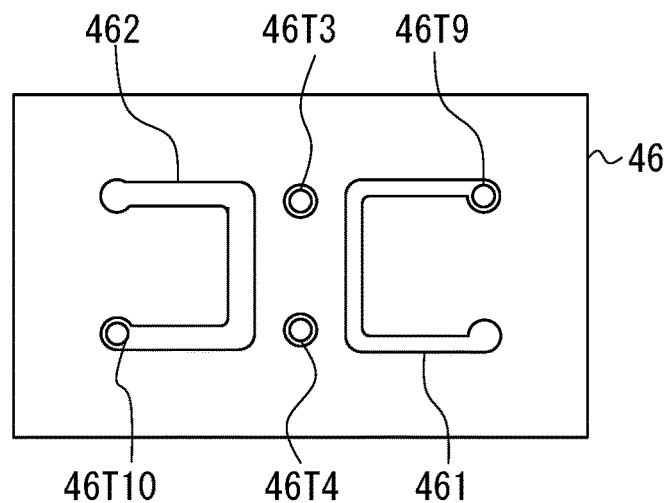
FIG. 13B is an explanatory diagram illustrating a patterned surface of a sixteenth dielectric layer of the multilayer stack shown in FIG. 3.
Figure 13C:
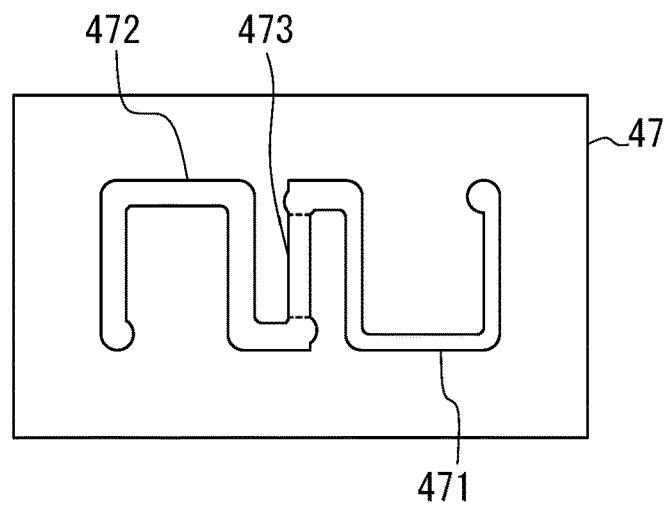
FIG. 13C is an explanatory diagram illustrating a patterned surface of a seventeenth dielectric layer of the multilayer stack shown in FIG. 3.
Figure 14:
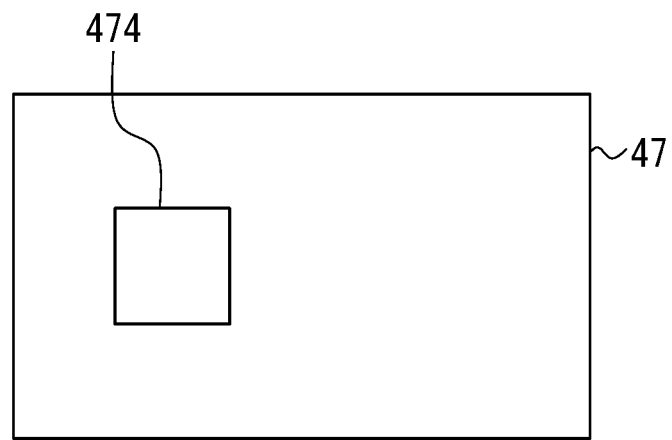
FIG. 14 is an explanatory diagram illustrating a marked surface of the seventeenth dielectric layer of the multilayer stack shown in FIG. 3.

An example configuration of the multilayer stack 10 corresponding to the circuit configuration of FIG. 8 will now be described with reference to FIG. 3, FIG. 4, and FIG. 9A to FIG. 14. The multilayer stack 10 includes seventeen dielectric layers stacked together. The seventeen dielectric layers will be referred to as the first to seventeenth dielectric layers in the order from bottom to top. FIG. 9A to FIG. 9C illustrate patterned surfaces of the first to third dielectric layers, respectively. FIG. 10A to FIG. 10C illustrate patterned surfaces of the fourth to sixth dielectric layers, respectively. FIG. 11A to FIG. 11C illustrate patterned surfaces of the seventh to ninth dielectric layers, respectively. FIG. 12A illustrates a patterned surface of the tenth dielectric layer. FIG. 12B illustrates a patterned surface of each of the eleventh to thirteenth dielectric layers. FIG. 12C illustrates a patterned surface of the fourteenth dielectric layer. FIG. 13A to FIG. 13C illustrate patterned surfaces of the fifteenth to seventeenth dielectric layers, respectively. FIG. 14 illustrates a marked surface of the seventeenth dielectric layer. The patterned surface and the marked surface of the seventeenth dielectric layer are opposite to each other.

On the patterned surface of the first dielectric layer 31, as shown in FIG. 9A, there are formed a conductor layer 311 used for forming the signal terminal 11, a conductor layer 312 used for forming the signal terminal 12, and a conductor layer 313 used for forming the ground terminal 13. Further, formed in the dielectric layer 31 are through holes 31T1 and 31T2 connected to the conductor layers 311 and 312, respectively, and through holes 31T3 and 31T4 connected to the conductor layer 313.

On the patterned surface of the second dielectric layer 32, as shown in FIG. 9B, there are formed a conductor layer 321 used for forming the capacitor C3, and a conductor layer 322 used for forming the capacitor C4. Further, through holes 32T1, 32T2, 32T3 and 32T4 are formed in the dielectric layer 32. The through hole 32T1 is connected to the conductor layer 321. The through hole 32T2 is connected to the conductor layer 322. The through holes 31T1 to 31T4 shown in FIG. 9A are connected to the through holes 32T1 to 32T4, respectively.

On the patterned surface of the third dielectric layer 33, as shown in FIG. 9C, there are formed a conductor layer 331 used for forming the capacitor C3, and a conductor layer 332 used for forming the capacitor C4. Further, through holes 33T1, 33T2, 33T3, 33T4, 33T5 and 33T6 are formed in the dielectric layer 33. The through hole 33T5 is connected to the conductor layer 331. The through hole 33T6 is connected to the conductor layer 332. The through holes 32T1 to 32T4 shown in FIG. 9B are connected to the through holes 33T1 to 33T4, respectively.

On the patterned surface of the fourth dielectric layer 34, as shown in FIG. 10A, there are formed a conductor layer 341 used for forming the capacitors C1 and C3, and a conductor layer 342 used for forming the capacitors C2 and C4. Further, through holes 34T1, 34T2, 34T3, 34T4, 34T5 and 32T6 are formed in the dielectric layer 34. The through hole 34T1 is connected to the conductor layer 341. The through hole 34T2 is connected to the conductor layer 342. The through holes 33T1 to 33T6 shown in FIG. 9C are connected to the through holes 34T1 to 34T6, respectively.

On the patterned surface of the fifth dielectric layer 35, as shown in FIG. 10B, there are formed a conductor layer 351 used for forming the capacitor C1, a conductor layer 352 used for forming the capacitor C2, and a conductor layer 353 connecting the conductor layers 351 and 352. In FIG. 10B the boundary between the conductor layers 351 and 353 and the boundary between the conductor layers 352 and 353 are indicated by broken lines. Further, formed in the dielectric layer 35 are through holes 35T1, 35T2, 35T3, 35T4, 35T5, 35T6, 35T7 and 35T8. The through hole 35T7 is connected to the conductor layer 351. The through hole 35T8 is connected to the conductor layer 352. The through holes 34T1 to 34T6 shown in FIG. 10A are connected to the through holes 35T1 to 35T6, respectively.

On the patterned surface of the sixth dielectric layer 36, as shown in FIG. 10C, there are formed a conductor layer 361 used for forming the capacitor C1, a conductor layer 362 used for forming the capacitor C2, and conductor layers 363 and 364 connected to the shield 20. Further, formed in the dielectric layer 36 are through holes 36T1, 36T2, 36T3, 36T4, 36T5, 36T6, 36T7 and 36T8. The through hole 36T1 is connected to the conductor layer 361. The through hole 36T2 is connected to the conductor layer 362. The through hole 36T3 is connected to the conductor layer 363. The through hole 36T4 is connected to the conductor layer 364. The through holes 35T1 to 35T8 shown in FIG. 10B are connected to the through holes 36T1 to 36T8, respectively.

On the patterned surface of the seventh dielectric layer 37, as shown in FIG. 11A, there are formed a conductor layer 371 used for forming the capacitor C1, and a conductor layer 372 used for forming the capacitor C2. Further, formed in the dielectric layer 37 are through holes 37T1, 37T2, 37T3, 37T4, 37T5, 37T6 and 37T7. The through hole 37T7 is connected to the conductor layer 371. The through holes 36T1 to 36T7 shown in FIG. 10C are connected to the through holes 37T1 to 37T7, respectively. The through hole 36T8 shown in FIG. 10C is connected to the conductor layer 372.

On the patterned surface of the eighth dielectric layer 38, as shown in FIG. 11B, there are formed a conductor layer 381 used for forming the capacitor C1, and a conductor layer 382 used for forming the capacitors C2 and C4. Further, formed in the dielectric layer 38 are through holes 38T1, 38T3, 38T4, 38T5, 38T6 and 38T7. The through hole 38T1 is connected to the conductor layer 381. The through holes 37T1 and 37T3 to 37T7 shown in FIG. 11A are connected to the through holes 38T1 and 38T3 to 38T7, respectively. The through hole 37T2 shown in FIG. 11A is connected to the conductor layer 382.

On the patterned surface of the ninth dielectric layer 39, as shown in FIG. 11C, there are formed a conductor layer 391 used for forming the capacitor C1, and a conductor layer 392 used for forming the capacitor C4. Further, formed in the dielectric layer 39 are through holes 39T1, 39T3, 39T4, 39T5 and 39T6. The through hole 39T6 is connected to the conductor layer 392. The through holes 38T1 and 38T3 to 38T6 shown in FIG. 11B are connected to the through holes 39T1 and 39T3 to 39T6, respectively. The through hole 38T7 shown in FIG. 11B is connected to the conductor layer 391.

On the patterned surface of the tenth dielectric layer 40, as shown in FIG. 12A, there is formed a conductor layer 401 used for forming the capacitor C1. Further, through holes 40T3, 40T4, 40T5 and 40T6 are formed in the dielectric layer 40. The through holes 39T3 to 39T6 shown in FIG. 11C are connected to the through holes 40T3 to 40T6, respectively. The through hole 39T1 shown in FIG. 11C is connected to the conductor layer 401.

As shown in FIG. 12B, through holes 41T3, 41T4, 41T5 and 41T6 are formed in each of the eleventh to thirteenth dielectric layers 41 to 43. In the dielectric layers 41 to 43, every vertically adjacent through holes denoted by the same reference signs are connected to each other. The through holes 40T3 to 40T6 shown in FIG. 12A are respectively connected to the through holes 41T3 to 41T6 formed in the dielectric layer 41.

As shown in FIG. 12C, conductor layers 441 and 442 are formed on the fourteenth dielectric layer 44. The conductor layer 441 is used for forming the inductor L1. The conductor layer 442 is used for forming the inductor L2. Each of the conductor layers 441 and 442 has a first end and a second end. Further, through holes 44T3, 44T4, 44T9 and 44T10 are formed in the dielectric layer 44. The through hole 44T9 is connected to a portion of the conductor layer 441 near the first end thereof. The through hole 44T10 is connected to a portion of the conductor layer 442 near the first end thereof. The through holes 41T3 and 41T4 formed in the dielectric layer 43 of FIG. 12B are connected to the through holes 44T3 and 44T4, respectively. The through hole 41T5 formed in the dielectric layer 43 of FIG. 12B is connected to a portion of the conductor layer 441 near the second end thereof. The through hole 41T6 formed in the dielectric layer 43 of FIG. 12B is connected to a portion of the conductor layer 442 near the second end thereof.

As shown in FIG. 13A, conductor layers 451 and 452 are formed on the fifteenth dielectric layer 45. The conductor layer 451 is used for forming the inductor L1. The conductor layer 452 is used for forming the inductor L2. Each of the conductor layers 451 and 452 has a first end and a second end. Further, through holes 45T3, 45T4, 45T9 and 45T10 are formed in the dielectric layer 45. The through hole 45T9 is connected to a portion of the conductor layer 451 near the first end thereof. The through hole 45T10 is connected to a portion of the conductor layer 452 near the first end thereof. The through holes 44T3 and 44T4 shown in FIG. 12C are connected to the through holes 45T3 and 45T4, respectively. The through hole 44T9 shown in FIG. 12C is connected to a portion of the conductor layer 451 near the second end thereof. The through hole 44T10 shown in FIG. 12C is connected to a portion of the conductor layer 452 near the second end thereof.

As shown in FIG. 13B, conductor layers 461 and 462 are formed on the sixteenth dielectric layer 46. The conductor layer 461 is used for forming the inductor L1. The conductor layer 462 is used for forming the inductor L2. Each of the conductor layers 461 and 462 has a first end and a second end. Further, through holes 46T3, 46T4, 46T9 and 46T10 are formed in the dielectric layer 46. The through hole 46T9 is connected to a portion of the conductor layer 461 near the first end thereof. The through hole 46T10 is connected to a portion of the conductor layer 462 near the first end thereof. The through holes 45T3 and 45T4 shown in FIG. 13A are connected to the through holes 46T3 and 46T4, respectively. The through hole 45T9 shown in FIG. 13A is connected to a portion of the conductor layer 461 near the second end thereof. The through hole 45T10 shown in FIG. 13A is connected to a portion of the conductor layer 462 near the second end thereof.

As shown in FIG. 13C, conductor layers 471, 472 and 473 are formed on the seventeenth dielectric layer 47. The conductor layer 471 is used for forming the inductor L1. The conductor layer 472 is used for forming the inductor L2. Each of the conductor layers 471 and 472 has a first end and a second end. The conductor layer 473 is connected to the first end of the conductor layer 471 and the first end of the conductor layer 472. In FIG. 13C the boundary between the conductor layers 471 and 473 and the boundary between the conductor layers 472 and 473 are indicated by broken lines. The through hole 46T3 shown in FIG. 13B is connected to a portion of the conductor layer 471 near the first end thereof. The through hole 46T4 shown in FIG. 13B is connected to a portion of the conductor layer 472 near the first end thereof. The through hole 46T9 shown in FIG. 13B is connected to a portion of the conductor layer 471 near the second end thereof. The through hole 46T10 shown in FIG. 13B is connected to a portion of the conductor layer 472 near the second end thereof.

As shown in FIG. 14, a mark layer 474 formed of a conductor layer lies on the marked surface of the seventeenth dielectric layer 47.

The multilayer stack 10 shown in FIG. 3 and FIG. 4 is formed by stacking the first to seventeenth dielectric layers 31 to 47 such that the patterned surface of the first dielectric layer 31 also serves as the bottom surface 10A of the multilayer stack 10, while the marked surface of the seventeenth dielectric layer 47 and the top surface of the mark layer 474 constitute the top surface 10B of the multilayer stack 10.

Correspondences between the circuit components of the electric component 1 shown in FIG. 8 and the internal components of the multilayer stack 10 shown in FIG. 3, FIG. 4 and FIG. 9A to FIG. 14 will now be described. The capacitor C1 is composed of the conductor layers 341, 351, 361, 371, 381, 391 and 401 shown in FIG. 10A to FIG. 12A, and the dielectric layers 34 to 39 each interposed between two of those conductor layers. The conductor layers 341, 361, 381 and 401 are connected to the conductor layer 311 forming the signal terminal 11, via the through holes 31T1, 32T1, 33T1, 34T1, 35T1, 36T1, 37T1, 38T1 and 39T1. The conductor layers 351, 371 and 391 are connected to each other via the through holes 35T7, 36T7, 37T7 and 38T7.

The capacitor C2 is composed of the conductor layers 342, 352, 362, 372 and 382 shown in FIG. 10A to FIG. 11B, and the dielectric layers 34 to 37 each interposed between two of those conductor layers. The conductor layers 342, 362 and 382 are connected to the conductor layer 312 forming the signal terminal 12, via the through holes 31T2, 32T2, 33T2, 34T2, 35T2, 36T2 and 37T2. The conductor layer 352 is connected via the conductor layer 353 to the conductor layer 351 forming the capacitor C1. The conductor layers 352 and 372 are connected to each other via the through holes 35T8 and 36T8.

The capacitor C3 is composed of the conductor layers 321, 331 and 341 shown in FIG. 9B to FIG. 10A, and the dielectric layers 32 and 33 each interposed between two of those conductor layers. The conductor layers 321 and 341 are connected to the conductor layer 311 forming the signal terminal 11, via the through holes 31T1, 32T1 and 33T1.

The capacitor C4 is composed of: the conductor layers 322, 332 and 342 shown in FIG. 9B to FIG. 10A and the dielectric layers 32 and 33 each interposed between two of those conductor layers; and the conductor layers 382 and 392 shown in FIG. 11B and FIG. 11C and the dielectric layer 38 interposed therebetween. The conductor layers 322, 342 and 382 are connected to the conductor layer 312 forming the signal terminal 12, via the through holes 31T2, 32T2, 33T2, 34T2, 35T2, 36T2 and 37T2.

The inductor L1 is composed of the conductor layers 441, 451, 461 and 471 shown in FIG. 12C to FIG. 13C and the through holes connected to those conductor layers. The conductor layer 441 is connected to the conductor layer 331 forming the capacitor C3, via the through holes 33T5, 34T5, 35T5, 36T5, 37T5, 38T5, 39T5, 40T5 and 41T5. The conductor layer 471 is connected to the conductor layer 313 forming the ground terminal 13, via the through holes 31T3, 32T3, 33T3, 34T3, 35T3, 36T3, 37T3, 38T3, 39T3, 40T3, 41T3, 44T3, 45T3 and 46T3.

The inductor L2 is composed of the conductor layers 442, 452, 462 and 472 shown in FIG. 12C to FIG. 13C and the through holes connected to those conductor layers. The conductor layer 442 is connected to the conductor layers 332 and 392 forming the capacitor C4, via the through holes 33T6, 34T6, 35T6, 36T6, 37T6, 38T6, 39T6, 40T6 and 41T6. The conductor layer 472 is connected to the conductor layer 313 forming the ground terminal 13, via the through holes 31T4, 32T4, 33T4, 34T4, 35T4, 36T4, 37T4, 38T4, 39T4, 40T4, 41T4, 44T4, 45T4 and 46T4.

As mentioned previously, the multilayer stack 10 includes two connecting portions electrically connecting the shield 20 and the ground terminals 11 and 13. The through holes 31T3, 32T3, 33T3, 34T3 and 35T3 and the conductor layer 363 constitute one of the two connecting portions. The through holes 31T4, 32T4, 33T4, 34T4 and 35T4 and the conductor layer 364 constitute the other of the two connecting portions.

A manufacturing method for the electronic component 1 according to the present embodiment will now be described with reference to FIG. 15. The manufacturing method for the electronic component 1 according to the present embodiment includes the step of fabricating a structure including the multilayer stack 10 and the terminals 11, 12 and 13, and the step of forming the shield 20 on the multilayer stack in the structure.

In the present embodiment, the multilayer stack 10 is fabricated by a low-temperature co-firing method, using ceramic as the material of the plurality of dielectric layers of the multilayer stack 10. In this manufacturing method, a plurality of multilayer stacks 10 are fabricated at a time. The manufacturing method for the electronic component 1 in this case will be described in detail below with reference to FIG. 15.

Figure 15:
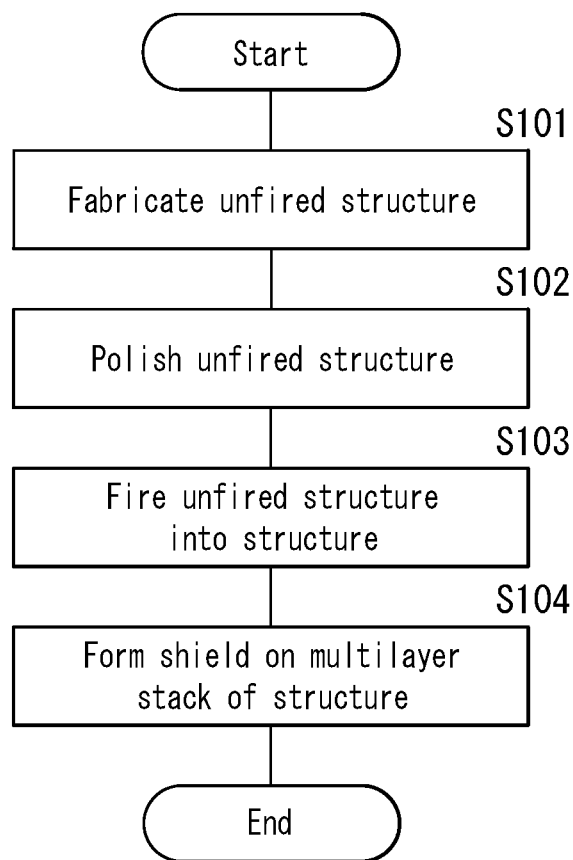
FIG. 15 is a flowchart illustrating a manufacturing method for the multilayer electronic component according to the first embodiment of the invention.

As shown in FIG. 15, the manufacturing method for the electronic component 1 includes the step S101 of fabricating an unfired structure which will be fired later into the structure, the step S102 of polishing the unfired structure, the step S103 of firing the polished unfired structure into the structure, and the step S104 of forming the shield 20 on the multilayer stack in the structure. The steps S101 to S103 correspond to the aforementioned step of fabricating the structure.

In the step S101 of fabricating the unfired structure, first fabricated are a plurality of unfired ceramic sheets corresponding to the plurality of dielectric layers. Each unfired ceramic sheet includes a plurality of pre-dielectric-layer portions which are to become a plurality of dielectric layers of the same type. In each unfired ceramic sheet, the plurality of pre-dielectric-layer portions are arranged in rows such that a number of pre-dielectric-layer portions align in each of vertical and horizontal directions.

In the step S101 of fabricating the unfired structure, one or more holes to become one or more through holes are then formed in each of the plurality of pre-dielectric-layer portions of the unfired ceramic sheets that are intended to form dielectric layers each having one or more through holes. Next, either one or both of an unfired through-hole-forming conductor portion and an unfired conductor layer are formed in each of the plurality of pre-dielectric-layer portions of the unfired ceramic sheets that are intended to form dielectric layers having through holes therein and/or conductor layers thereon. The unfired through-hole-forming conductor portion is to be fired later into a conductor portion forming a through hole. The unfired conductor layer is to be fired later into a conductor layer. At this point in time, any unfired conductor layers that are to later become the mark layers 474 are not formed yet.

In the step S101 of fabricating the unfired structure, an unfired sheet stack is then formed by stacking the plurality of unfired ceramic sheets in the order corresponding to the order of stacking of the plurality of dielectric layers. Next, a plurality of unfired conductor layers that are to later become the mark layers 474 are formed on a particular unfired ceramic sheet that is intended to form the dielectric layers 47, among the unfired ceramic sheets of the unfired sheet stack. The unfired sheet stack is then subjected to heat and pressure to cause the plurality of unfired ceramic sheets to be integral with each other. Next, the unfired sheet stack is cut into a plurality of unfired structures.

The mark layer 474 may be formed on a different dielectric layer than the dielectric layer 47. In such a case, an unfired ceramic sheet having a plurality of unfired conductor layers to become the mark layers 474 and the other ceramic sheets may be stacked together into an unfired sheet stack.

In the step S102, a plurality of unfired structures produced in the step S101 are polished to provide each of the unfired structures with a plurality of rounded corners. For example, barrel polishing is employed to polish the unfired structures.

In the step S103, the polished unfired structures are fired into a plurality of structures.

In the step S104, the shield 20 is formed on the multilayer stack 10 of each of the plurality of structures. At least part of the shield 20 may be formed by sputtering. When the shield 20 is composed of the metal layers 21, 22 and 23, all the metal layers 21, 22 and 23 may be formed by sputtering. Alternatively, the metal layer 21 may be formed by sputtering, the metal layer 22 may be formed by plating, and the metal layer 23 may be formed by sputtering or plating.

Now, the effects of the electronic component 1 according to the present embodiment and its manufacturing method will be described. In the electronic component 1, the shield 20 entirely covers the top surface 10B and the four side surfaces 10C to 10F of the multilayer stack 10. This configuration enables prevention of the occurrence of electromagnetic troubles associated with increased packing density. This will be described in detail below.

The shield 20 prevents electromagnetic waves produced by the components inside the multilayer stack 10 of the electronic component 1 from leaking externally, and prevents electromagnetic waves produced by another electronic component mounted near the electronic component 1 from entering the multilayer stack 10 of the electronic component 1. The electronic component 1 thus produces the effect of preventing electromagnetic interference between a plurality of electronic components attributable to increased packing density. This effect includes the effect of preventing the electromagnetic waves produced by the components inside the multilayer stack 10 from adversely affecting another electronic component, and the effect of preventing the electromagnetic waves produced by another electronic component from adversely affecting the electronic component 1.

An apparatus including a plurality of electronic components including the electronic component 1 may sometimes be provided with a shield case for covering the electronic components. In such an apparatus, the shield 20 prevents the formation of capacitance by a conductor inside the multilayer stack 10 of the electronic component 1 and the shield case. This prevents the characteristics of the electronic component 1 as packaged from differing from the characteristics as designed.

Among the components inside the multilayer stack 10 of the electronic component 1, components that produce electromagnetic waves include the two coils forming the inductors L1 and L2. As described previously, the coil forming the inductor L1 is wound around the central axis CA1 extending in the second direction D2, and the coil forming the inductor L2 is wound around the central axis CA2 extending in the second direction D2. The electromagnetic waves produced by each of the two coils forming the inductors L1 and L2 contain components in various directions, among which the component in the second direction D2 parallel to the central axes CA1 and CA2 is of the greatest magnitude. On the other hand, of the five portions 20B to 20F of the shield 20, it is the top covering portion 20B that intersects the central axes CA1 and CA2. Thus, making the top covering portion 20B thicker than the side covering portions 20C to 20F enables effective prevention of external leakage of the electromagnetic waves produced by the two coils.

Thickening all of the five portions 20B to 20F of the shield 20 would increase the footprint of the electronic component 1 on the mount substrate, thus interfering with higher packing densities. By making the top covering portion 20B thicker than the side covering portions 20C to 20F in the shield 20, external leakage of the electromagnetic waves produced by the two coils is effectively prevented without interfering with higher packing densities.

Figure 16:
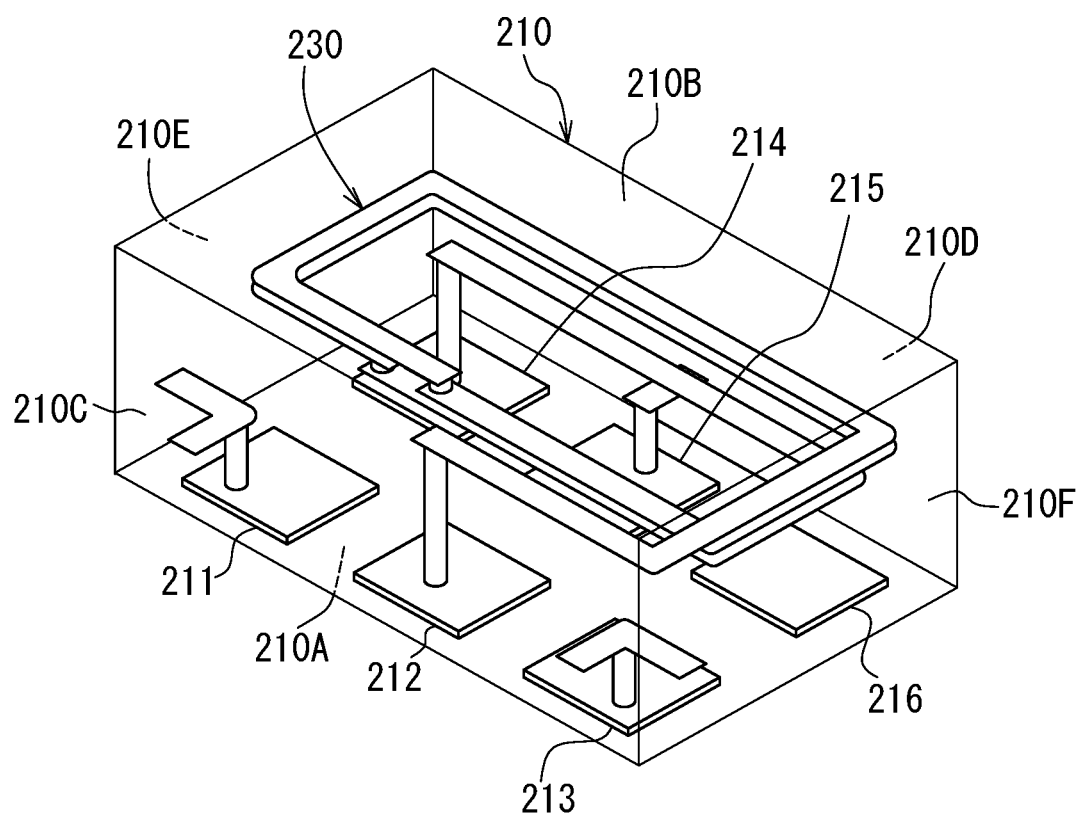
FIG. 16 is a perspective view for explanations of the configurations of a first to a third model of electronic components used for simulation.

Now, a description will be given of simulation results demonstrating the effect of the shield 20. FIG. 16 is a perspective view for explanations of the configurations of a first to a third model of electronic components used for the simulation. Each of the first to the third model includes a multilayer stack 210 and six terminals 211, 212, 213, 214, 215 and 216. The multilayer stack 210 has a bottom surface 210A, a top surface 210B, and four side surfaces 210C to 210F. The six terminals 211 to 216 are provided on the bottom surface 210A.

The terminals 212 and 214 are signal terminals. The terminals 211, 213 and 215 are ground terminals connected to the ground. The terminal 216 is a no-connect terminal.

The multilayer stack 210 includes a coil 210. One end of the coil 210 is electrically connected to the signal terminal 212, and the other end of the coil 210 is electrically connected to the signal terminal 214.

The first model includes no shield. Each of the second and third models includes a shield. The shield includes a top covering portion covering the top surface 210B of the multilayer stack 210, and four side covering portions covering the four side surfaces 210C to 210F of the multilayer stack 210. In each of the second and third models, the ground terminals 211, 213 and 215 are electrically connected to the shield.

The coil 230 is wound around a central axis (not illustrated), and the top covering portion of the shield intersects the central axis. In the second model, the top covering portion and the four side covering portions of the shield are all 1 µm thick. In the third model, the top covering portion of the shield is 2 µm thick, and the four side covering portions of the shield are 1 µm thick.

Figure 17:
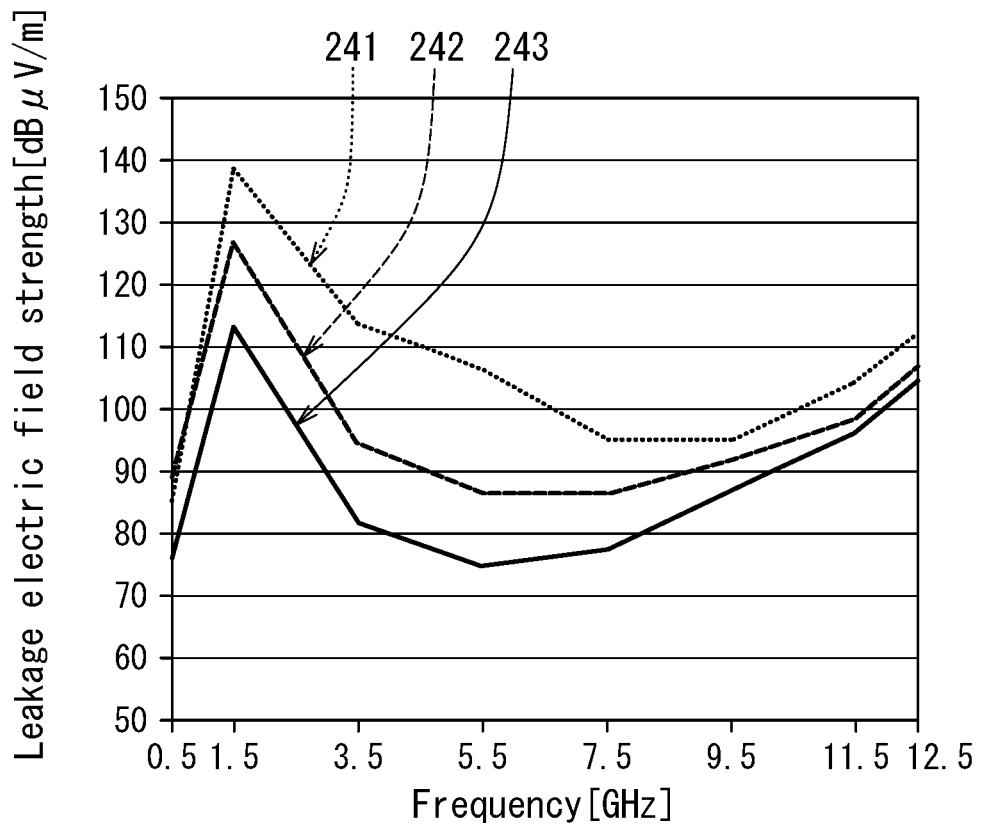
FIG. 17 is a characteristic diagram illustrating simulation results.

On the first to third models, the simulation examined the frequency characteristic of leakage electric field strength. As used herein, the leakage electric field strength refers to the strength of an electric field leaking to the surroundings of the electronic component when a current is passed through the coil 230. The simulation results are shown in FIG. 17. In FIG. 17 the horizontal axis represents frequency, and the vertical axis represents the leakage electric field strength. Further, in FIG. 17 the line 241 represents the characteristic of the first model, the line 242 represents the characteristic of the second model, and the line 243 represents the characteristic of the third model.

The leakage electric field strength of the second model is lower than that of the first model over almost the entire frequency range on the horizontal axis of FIG. 17. Further, the leakage electric field strength of the third model is lower than that of each of the first and second models over the entire frequency range on the horizontal axis of FIG. 17. It can be seen from FIG. 17 that providing a shield can inhibit the electromagnetic waves produced by the coil 230 from externally leaking from the electronic component. It can also be seen from FIG. 17 that making the top covering portion thicker than the four side covering portions in the shield can more effectively inhibit the electromagnetic waves produced by the coil 230 from externally leaking from the electronic component.

Another effect of the electronic component 1 according to the present embodiment will now be described. In the present embodiment, the shield 20 may include a plurality of metal layers stacked together. In such a case, it is preferred that each of the plurality of metal layers include a top-surface-corresponding portion and four side-surface-corresponding portions, and that the top-surface-corresponding portion and the four side-surface-corresponding portions be contiguous. Such a configuration enables the shield 20 to entirely cover the top surface 10B and the four side surfaces 10C to 10F of the multilayer stack 10 with reliability, and enables the effect of the shield 20 to be exerted with reliability.

In the present embodiment, the multilayer stack 10 may have a plurality of rounded corners. This enables the material forming the shield 20 to adhere to the corners of the multilayer stack 10 with reliability, thus making it possible to prevent the shield 20 from becoming chipped at the corners of the multilayer structure 10.

In the present embodiment, the shield 20 may include the partial covering portion 20P. The partial covering portion 20P has the function of inhibiting electromagnetic waves from passing through a gap between the bottom surface 10A of the multilayer stack 10 and the top surface 110a of the substrate body 110 of the mount substrate 100. This enables more effective prevention of the occurrence of electromagnetic troubles associated with increased packing densities.

In the present embodiment, the top surface 10B of the multilayer stack 10 includes the mark portion 10B1 and the peripheral portion 10B2 with a difference in level therebetween. Accordingly, in the present embodiment, the top surface of the top covering portion 20B of the shield 20 includes the mark-corresponding portion 20B1 and the periphery-corresponding portion 20B2 with a difference in level therebetween. By virtue of such a configuration, the mark-corresponding portion 20B1 corresponding to the mark portion 10B1 is recognizable even if the mark portion 10B1 is covered with the top covering portion 20B of the shield 20. In other words, the present embodiment allows the top surface 10B and the side surfaces 10C to 10F of the multilayer stack 10 to be entirely covered by the shield 20 while providing a mark that is recognizable from above.

The manufacturing method for the electronic component 1 according to the present embodiment enables the top covering portion 20B and the four side covering portions 20C to 20F of the shield 20 to be formed at a time such that they are contiguous. The manufacturing method according to the present embodiment thus facilitates the formation of the shield 20 which is able to entirely cover the top surface 10B and the four side surfaces 10C to 10F of the multilayer stack 10 with reliability.

When the shield 20 includes the partial covering portion 20P, the manufacturing method according to the present embodiment forms the shield 20 such that the material forming the shield 20 extends partially onto the bottom surface 10A of the multilayer stack 10. This enables the partial covering portion 20P to be formed simultaneously with the top covering portion 20B and the side covering portions 20C to 20F.

Figure 18:
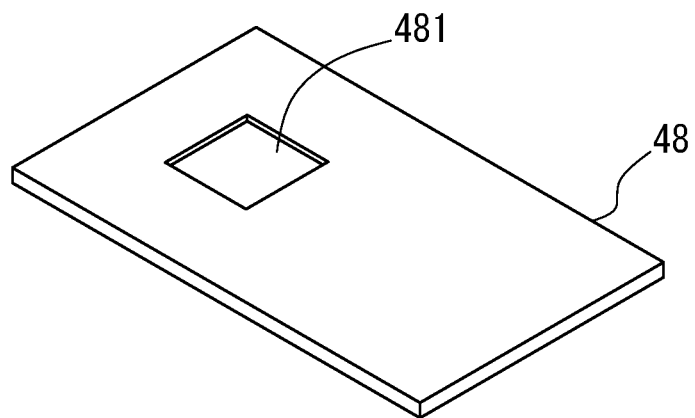
FIG. 18 is a perspective view illustrating a dielectric layer with a mark portion in a modification example of the multilayer electronic component according to the first embodiment of the invention.

Reference is now made to FIG. 18 to describe a modification example of the electronic component 1 according to the present embodiment. The modification example is an example in which the mark portion 10B1 is recessed from the peripheral portion 10B2. In the modification example, the multilayer stack 10 includes an eighteenth dielectric layer 48. FIG. 18 illustrates the eighteenth dielectric layer 48. The eighteenth dielectric layer 48 has a marked surface with a recess 481 formed therein.

In the modification example, the multilayer stack 10 is formed by stacking the first to eighteenth dielectric layers 31 to 48 such that the marked surface of the dielectric layer 48 also serves as the top surface 10B of the multilayer stack 10. The bottom of the recess 481 forms the mark portion 10B1, and the other portion of the marked surface than the recess 481 forms the peripheral portion 10B2.

In the modification example also, the top surface of the top covering portion 20B of the shield 20 includes the mark-corresponding portion 20B1. The mark-corresponding portion 20B1 in the modification example is recessed from the periphery-corresponding portion 20B2. The mark-corresponding portion 20B1 corresponding to the mark portion 10B1 is recognizable also in the modification example.

Second Embodiment

Figure 19:
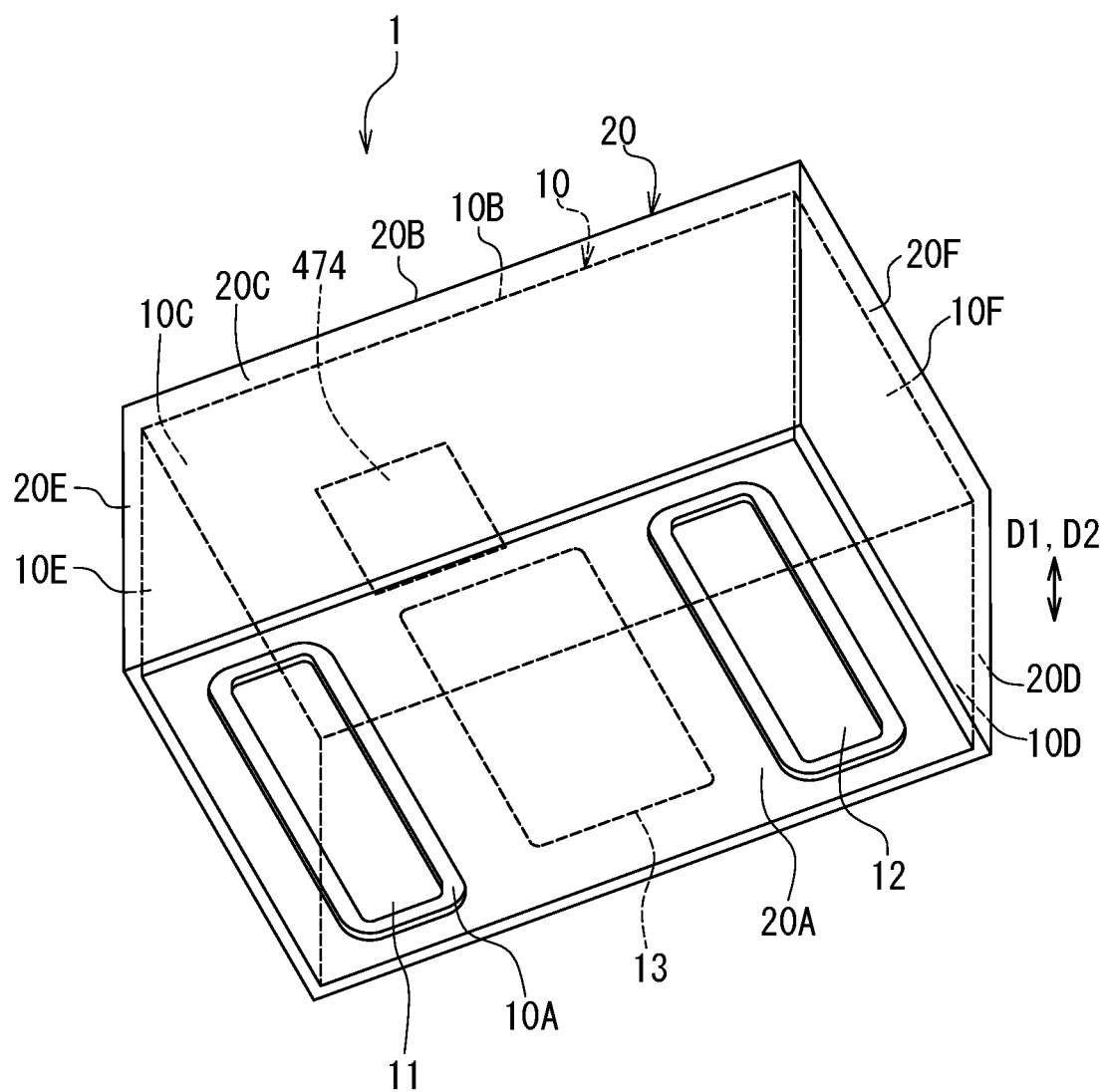
FIG. 19 is a perspective view illustrating the bottom of a multilayer electronic component according to a second embodiment of the invention.
Figure 20:
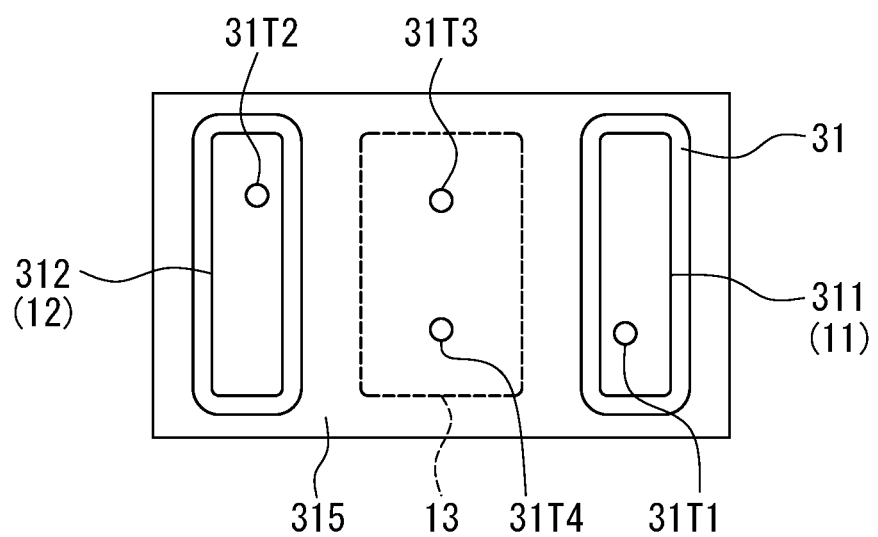
FIG. 20 is an explanatory diagram illustrating a patterned surface of a first dielectric layer of a multilayer stack in the multilayer electronic component according to the second embodiment of the invention.

An electronic component 1 according to a second embodiment of the invention will now be described with reference to FIG. 19 and FIG. 20. FIG. 19 is a perspective view illustrating the bottom of the electronic component 1 according to the second embodiment. FIG. 20 is an explanatory diagram illustrating the patterned surface of the first dielectric layer 31 of the multilayer stack 10 in the second embodiment.

In the present embodiment, as shown in FIG. 19, the shield 20 includes a bottom covering portion 20A in addition to the top covering portion 20B and the side covering portions 20C to 20F. The bottom covering portion 20A partially covers the bottom surface 10A of the multilayer stack 10 and is connected to the ground terminal without coming into contact with the plurality of signal terminals 11 and 12.

In the present embodiment, as shown in FIG. 20, conductor layers 311, 312 and 315 are formed on the patterned surface of the first dielectric layer 31 of the multilayer stack 10. The conductor layers 311 and 312 are the same as those of the first embodiment. The conductor layer 315 covers the patterned surface of the dielectric layer 31 excluding portions on which the conductor layers 311 and 312 are disposed and their surrounding portions having a certain width.

A portion of the conductor layer 315 corresponding to the conductor layer 313 of FIG. 9A forms the ground terminal 13. The rest of the conductor layer 315 forms the bottom covering portion 20A.

Through holes 31T1, 31T2, 31T3 and 31T4 are formed in the dielectric layer 31. The locations of the through holes 31T1, 31T2, 31T3 and 31T4 in the dielectric layer 31 are the same as those in the first embodiment. The through holes 31T3 and 31T4 are connected to the portion of the conductor layer 315 forming the ground terminal 13.

In the present embodiment, the shield 20 does not include the partial covering portion 20P of the first embodiment. The side covering portions 20C to 20F are connected to the bottom covering portion 20A.

In the electronic component 1 according to the present embodiment, most of the bottom surface 10A of the multilayer stack 10, excluding portions on which the signal terminals 11 and 12 are disposed, is covered by the ground terminal 13 and the bottom covering portion 20A of the shield 20. According to the present embodiment, this configuration enables more effective prevention of the occurrence of electromagnetic troubles associated with increased packing densities.

The other configuration, function, and effects of the present embodiment are the same as those of the first embodiment.

The present invention is not limited to the foregoing embodiments, and various modifications may be made thereto. For example, the foregoing embodiments illustrate an example in which the first direction D1 and the second direction D2 are the same direction; however, the first direction D1 and the second direction D2 may be different directions. Further, at least one of the first and second directions D1 and S2 may be orthogonal to the direction in which the plurality of dielectric layers of the multilayer stack 10 are stacked.

Figure 8:
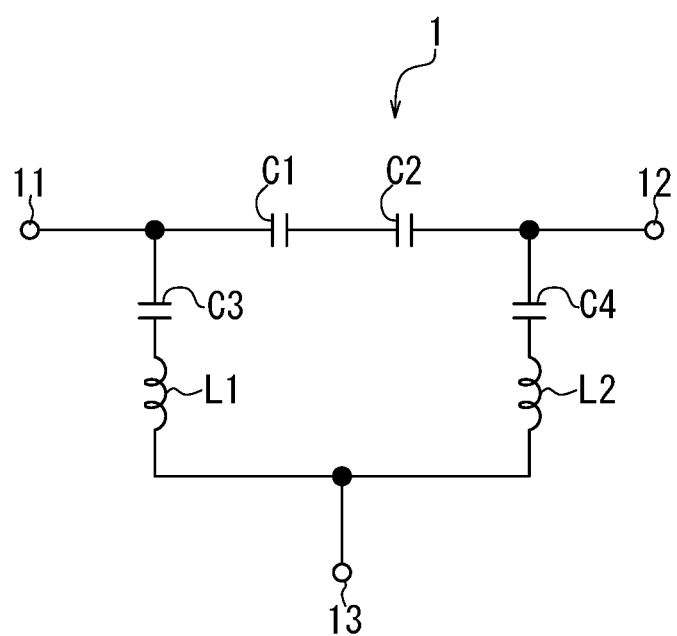
FIG. 8 is a circuit diagram illustrating an example of circuit configuration of the multilayer electronic component according to the first embodiment of the invention.

As far as the requirements of the appended claims are met, the present invention is applicable not only to electronic components having the circuit configuration of FIG. 8 but also to electronic components having any other various circuit configurations.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A multilayer electronic component comprising:
a multilayer stack including a plurality of dielectric layers and a plurality of conductor layers stacked together;
a plurality of terminals integrated with the multilayer stack; and
a shield formed of a conductor and integrated with the multilayer stack, wherein
the multilayer stack has a top surface and a bottom surface located at opposite ends in a first direction, and four side surfaces connecting the top surface and the bottom surface,
the plurality of terminals are provided on the bottom surface of the multilayer stack,
the shield entirely covers the top surface and the four side surfaces of the multilayer stack, and
the shield includes a portion thicker than the other portions of the shield.

2. The multilayer electronic component according to claim 1, wherein
the shield includes a top covering portion covering the top surface of the multilayer stack, and four side covering portions covering the four side surfaces of the multilayer stack, and
the top covering portion is thicker than the four side covering portions.

3. The multilayer electronic component according to claim 1, wherein
the multilayer stack includes a coil wound around a central axis extending in a second direction,
the shield includes five portions that respectively cover the top surface and the four side surfaces of the multilayer stack, and of the five portions, one or two portions that intersect the central axis are thicker than the others of the five portions.

4. The multilayer electronic component according to claim 3, wherein one of the five portions that covers the top surface of the multilayer stack intersects the central axis.

5. A multilayer electronic component comprising:
a multilayer stack including a plurality of dielectric layers and a plurality of conductor layers stacked together;
a plurality of terminals integrated with the multilayer stack; and
a shield formed of a conductor and integrated with the multilayer stack, wherein
the multilayer stack has a top surface and a bottom surface located at opposite ends in a first direction, and four side surfaces connecting the top surface and the bottom surface,
the plurality of terminals are provided on the bottom surface of the multilayer stack,
the shield entirely covers the top surface and the four side surfaces of the multilayer stack,
the shield includes a plurality of metal layers stacked together,
each of the plurality of metal layers includes a top-surface-corresponding portion covering the top surface of the multilayer stack, and four side-surface-corresponding portions respectively covering the four side surfaces of the multilayer stack, and
the top-surface-corresponding portion and the four side-surface-corresponding portions are contiguous.

6. A multilayer electronic component comprising:
a multilayer stack including a plurality of dielectric layers and a plurality of conductor layers stacked together;
a plurality of terminals integrated with the multilayer stack; and
a shield formed of a conductor and integrated with the multilayer stack, wherein
the multilayer stack has a top surface and a bottom surface located at opposite ends in a first direction, and four side surfaces connecting the top surface and the bottom surface,
the plurality of terminals are provided on the bottom surface of the multilayer stack,
the shield entirely covers the top surface and the four side surfaces of the multilayer stack, and
the shield includes a top covering portion covering the top surface of the multilayer stack, four side covering portions covering the four side surfaces of the multilayer stack, and a partial covering portion contiguous to the four side covering portions and partially covering the bottom surface of the multilayer stack.

7. A multilayer electronic component comprising:
a multilayer stack including a plurality of dielectric layers and a plurality of conductor layers stacked together;
a plurality of terminals integrated with the multilayer stack; and
a shield formed of a conductor and integrated with the multilayer stack, wherein
the multilayer stack has a top surface and a bottom surface located at opposite ends in a first direction, and four side surfaces connecting the top surface and the bottom surface,
the plurality of terminals are provided on the bottom surface of the multilayer stack,
the shield entirely covers the top surface and the four side surfaces of the multilayer stack,
the top surface of the multilayer stack includes a mark portion and a peripheral portion around the mark portion,
there is a difference in level between the mark portion and the peripheral portion,
the shield includes a top covering portion covering the top surface of the multilayer stack,
the top covering portion has a top surface including a mark-corresponding portion corresponding to the mark portion, and a periphery-corresponding portion corresponding to the peripheral portion, and
there is a difference in level between the mark-corresponding portion and the periphery-corresponding portion.

8. A multilayer electronic component comprising:
a multilayer stack including a plurality of dielectric layers and a plurality of conductor layers stacked together;
a plurality of terminals integrated with the multilayer stack; and
a shield formed of a conductor and integrated with the multilayer stack, wherein
the multilayer stack has a top surface and a bottom surface located at opposite ends in a first direction, and four side surfaces connecting the top surface and the bottom surface,
the plurality of terminals are provided on the bottom surface of the multilayer stack,
the shield entirely covers the top surface and the four side surfaces of the multilayer stack,
the plurality of terminals include a plurality of signal terminals, and a ground terminal connected to a ground, and
the shield includes a bottom covering portion that partially covers the bottom surface of the multilayer stack and that is connected to the ground terminal without coming into contact with the plurality of signal terminals.

* * * * *